(12) United States Patent
Yeh

(10) Patent No.: US 9,563,498 B2
(45) Date of Patent: Feb. 7, 2017

(54) METHOD FOR PREVENTING READ-DISTURB ERRORS, MEMORY CONTROL CIRCUIT UNIT AND MEMORY STORAGE APPARATUS

(71) Applicant: PHISON ELECTRONICS CORP., Miaoli (TW)

(72) Inventor: Chih-Kang Yeh, Kinmen County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 99 days.

(21) Appl. No.: 14/490,684

(22) Filed: Sep. 19, 2014

(65) Prior Publication Data

US 2016/0011930 A1 Jan. 14, 2016

(30) Foreign Application Priority Data

Jul. 11, 2014 (TW) .............................. 103123957 A

(51) Int. Cl.
*G11C 29/00* (2006.01)
*G06F 11/07* (2006.01)

(52) U.S. Cl.
CPC ......... *G06F 11/0793* (2013.01); *G06F 11/073* (2013.01); *G06F 11/076* (2013.01)

(58) Field of Classification Search
CPC .... G06F 11/0793; G06F 11/073; G06F 11/076
See application file for complete search history.

(56) References Cited

U.S. PATENT DOCUMENTS

2010/0115183 A1* 5/2010 Araki .................. G06F 12/0246
711/103
2014/0344643 A1* 11/2014 Hughes, Jr. ......... G06F 11/1048
714/763

* cited by examiner

*Primary Examiner* — April Y Blair
*Assistant Examiner* — Thien D Nguyen
(74) *Attorney, Agent, or Firm* — Jianq Chyun IP Office

(57) ABSTRACT

A method for preventing read-disturb errors, a memory storage apparatus and a memory control circuit unit are provided. The method includes counting an operation numerical value when receiving an operation command from the host system, wherein a first physical erasing unit is selected for executing the operation command. The method also includes selecting a second physical erasing unit and reading data from the second erasing unit. The method further includes determining whether a data error occurs at the second physical erasing unit according to the data read from the second physical erasing unit, and if the data error occurs, selecting a third physical erasing unit, correcting the data read from the second physical erasing unit to generate corrected data and writing the corrected data into the third physical erasing unit.

33 Claims, 17 Drawing Sheets

METHOD FOR PREVENTING READ-DISTURB ERRORS, MEMORY CONTROL CIRCUIT UNIT AND MEMORY STORAGE APPARATUS

CROSS-REFERENCE TO RELATED APPLICATION

This application claims the priority benefit of Taiwan application serial no. 103123957, filed on Jul. 11, 2014. The entirety of the above-mentioned patent application is hereby incorporated by reference herein and made a part of this specification.

BACKGROUND

1. Technology Field

The present invention relates to a method of preventing read-disturb errors for rewritable non-volatile memory module and a memory control circuit unit and a memory storage apparatus using the method.

2. Description of Related Art

Digital camera, cell phone, and MP3 player have a rapid growth in recent years and results in the need of storage medium for the consumers. Due to the fact that rewritable non-volatile memory possesses the characteristics of non-volatile data, power saving, small volume, lack of mechanical structure and fast reading and writing speed, rewritable non-volatile memory industry has become a popular role in the electronic industry. For example, the solid-state drive using flash memory as storage medium is widely used as hard drive of host computer to improve access performance of the computer.

NAND flash can be classified into the SLC (Single Level Cell) NAND flash, the MLC (Multi Level Cell) NAND flash and the TLC (Triple Level Cell) NAND flash according to the number of bits stored in each memory cell. Each memory cell of the SLC NAND flash memory stores 1 bit of data (i.e., "1" and "0"), each memory cell of the MLC NAND flash memory stores 2 bits of data and each memory cell of the TLC NAND flash memory stores 3 bits of data.

In NAND flash memory, one physical page is constituted by several memory cells arranged on the same word line. Because each memory cell of the SLC NAND flash stores 1 bit of data, the memory cells arranged on the same word line correspond to one physical page in the SLC NAND flash memory.

Compared with the SLC NAND flash memory, the floating gate storage of each memory cell of the MLC NAND flash memory stores 2 bits of data, in which each storage status (i.e., "11", "10", "01" and "00") includes LSB (Least Significant Bit) and MSB (Most Significant Bit). For example, the value of the first bit from the left in the storage status is LSB, and the value of the second bit from the left in the storage status is MSB. Therefore, the memory cells arranged on the same word line constitute 2 physical pages, in which the physical page constituted by LSBs of such memory cells is referred to as a low physical page, and the physical page constituted by MSBs of such memory cells is referred to as a upper physical page. Particularly, writing speed of the low physical page is faster than that of the upper physical page, and the data stored in the low physical page may be lost when an error occurs in the upper physical page.

Similarly, in TLC NAND flash memory, each memory cell stores 3 bits of data, in which each storage status (i.e., "111", "110", "101", "100", "011", "010", "001" and "000") includes the first bit from the left (LSB), the second bit from the left (Center Significant Bit, CSB) and the third bit from the left (MSB). Therefore, memory cells arranged on the same word line constitute 3 physical pages, in which the physical page constituted by LSBs of such memory cells is referred to as a low physical page, the physical page constituted by CSBs of such memory cells is referred to as a center physical page, and the physical page constituted by MSBs of such memory cells is referred to as a upper physical page.

However, regardless which kind of memory cell of flash memory module is chosen, after reading the data stored in the same physical block for multiple times, for example, a hundred thousand times to a million times, it is possible that the data read from the physical block is incorrect and the data stored in the block that has been read multiple times may be lost or an error may occur. Such phenomenon is referred to as "read-disturb errors" by one of skilled in the art. Particularly, system information of flash memory storage system, for example, firmware code or file allocation table, may be stored in the flash memory module, and the system information is read in a high frequency during system operation of flash memory. Because of such phenomenon, manufacturers are compelled to develop a mechanism that ensures correct data storage.

SUMMARY

The present invention provides a method for preventing read-disturb errors, a memory control circuit unit and a memory storage apparatus that effectively prevent occurrence of read-disturb errors.

According to an exemplary embodiment of the present invention, a method of preventing read-disturb errors for rewritable non-volatile memory module is provided, wherein the rewritable non-volatile memory module includes physical erasing units. The method includes counting an operation numerical value when receiving an operation command from a host system, wherein a first physical erasing unit among the physical erasing units is selected for executing the operation command. The method also includes selecting a second physical erasing unit among the physical erasing units and reading data from the second erasing unit if the operation numerical value is not smaller than an operation numerical threshold. The method further includes determining whether a data error occurs at the second physical erasing unit according to the data read from the second physical erasing unit; and if the data error occurs, selecting a third physical erasing unit among the physical erasing units, correcting the data read from the second physical erasing unit to generate corrected data and writing the corrected data into the third physical erasing unit.

According to an exemplary embodiment of the present invention, a memory control circuit unit for controlling rewritable non-volatile memory module is provided. The memory control circuit unit includes a host interface, a memory interface and a memory management circuit. The host interface is configured to couple to the host system. The memory interface is configured to couple to the rewritable non-volatile memory module, wherein the rewritable non-volatile memory module includes a plurality of physical erasing units. The memory management circuit is coupled to the host interface and the memory interface. Here, the memory management circuit is further configured to count an operation numeral value when an operation command is received from the host system, wherein a first physical erasing unit among the physical erasing units is selected to execute the operation command. Furthermore, the memory management circuit selects a second physical erasing unit among the physical erasing units and sends a first command sequence to read data from the second physical erasing unit when the operation numerical value is not smaller than an operation numerical threshold. Moreover, the memory management circuit determines whether a data error occurs according to the data read from the second physical erasing unit and if the data error occurs at the second physical erasing unit, the memory management circuit selects a third physical erasing unit among the physical erasing units, corrects the data read from the second physical erasing unit to generate corrected data and sends a second command sequence to write the corrected data into the third physical erasing unit.

According to an exemplary embodiment of the present invention, a memory storage apparatus including a connection interface unit, a rewritable non-volatile memory module and a memory control circuit unit. The connection interface unit is configured to couple to a host system. The rewritable non-volatile memory module includes a plurality of physical erasing units. The memory control circuit unit is coupled to the connection interface unit and the rewritable non-volatile memory module and counts an operation numerical value when an operation command is received from the host system. Here, the memory control circuit unit selects a second physical erasing unit among the physical erasing units and read data from the second physical erasing unit when the operation numerical value is not smaller than an operation numerical threshold. Furthermore, the memory control circuit unit determines whether a data error occurs at the second physical erasing unit according to the data read from the second physical erasing unit, and if the data error occurs at the second physical erasing unit, the memory control circuit unit selects a third physical erasing unit among the physical erasing units, corrects the data read from the second physical erasing unit to generate corrected data and writes the corrected data into the third physical erasing unit.

Based on the above description, the method for preventing read-disturb errors, the memory control circuit unit and the memory storage apparatus in the exemplary embodiment of the present invention selects another physical erasing unit not used for a currently received operation command to determine whether a data error occurs so as to monitor the entire system and effectively prevent the occurrence of read-disturb errors while maintaining the performance of the system.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
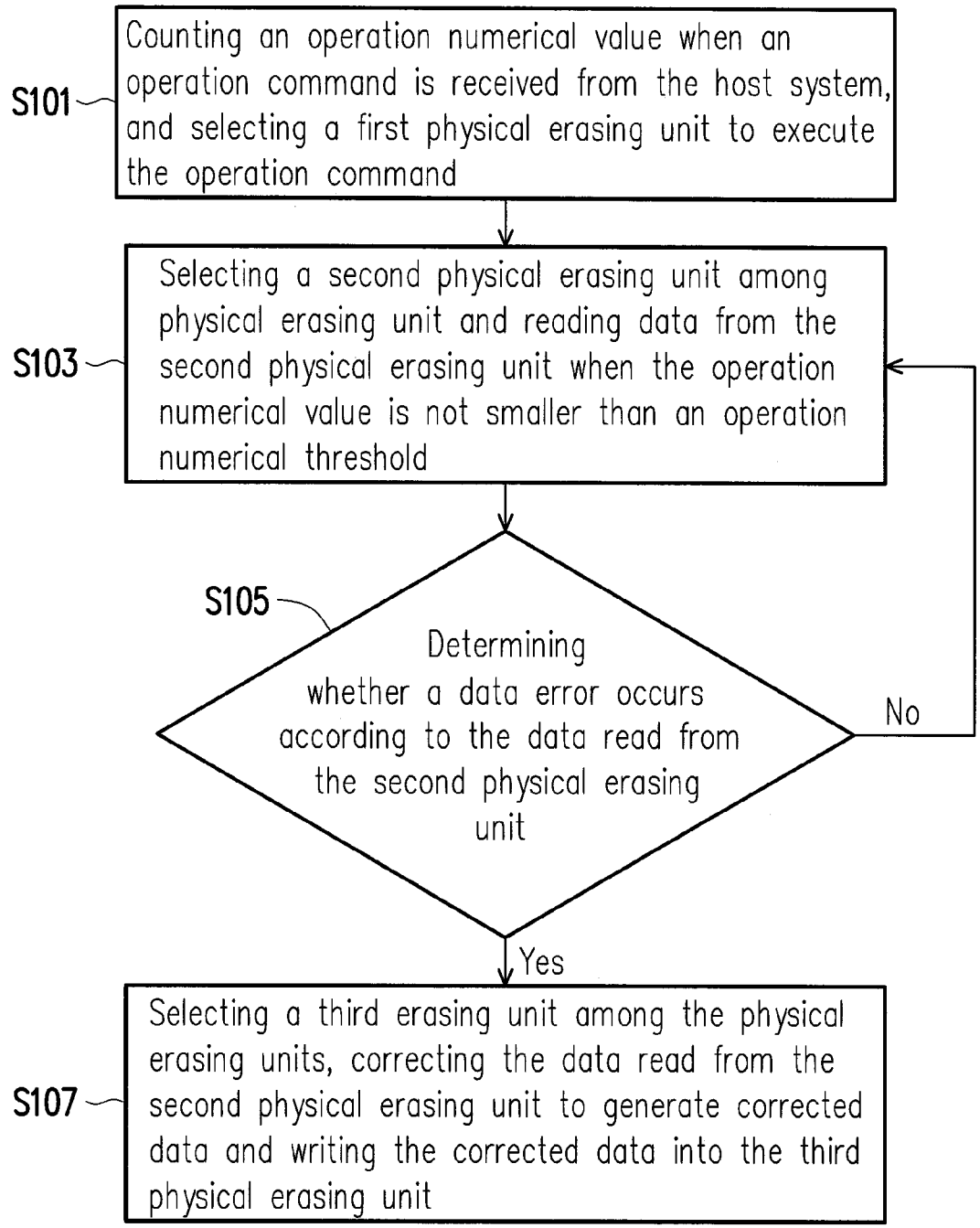
FIG. 1 is a flowchart illustrating the method for preventing read-disturb errors according to the present invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage apparatus (i.e., memory storage system) includes a rewritable non-volatile memory module and a controller (i.e., control circuit). The memory storage apparatus usually works together with a host system for the host system to write data into the memory storage apparatus or read data from the memory storage apparatus.

FIG. 1 is a flowchart illustrating a method of preventing read-disturb errors according to the present invention.

Referring to FIG. 1, in order to ensure that the data is correctly stored in the memory storage apparatus and effectively prevent the occurrence of read-disturb errors, the method for preventing read-disturb errors of the present invention includes counting an operation numerical value when an operation command is received from the host system, and selecting a first physical erasing unit to execute the operation command (S101); selecting a second physical erasing unit among physical erasing unit and reading data from the second physical erasing unit when the operation numerical value is not smaller than an operation numerical threshold (S103); determining whether a data error occurs according to the data read from the second physical erasing unit (S105); if the data error occurs at the second physical erasing unit, selecting a third erasing unit among the physical erasing units, correcting the data read from the second physical erasing unit to generate corrected data and writing the corrected data into the third physical erasing unit (S107). The present invention will be explained in detail by the exemplary embodiments described hereinafter.

First Exemplary Embodiment

Figure 2A:
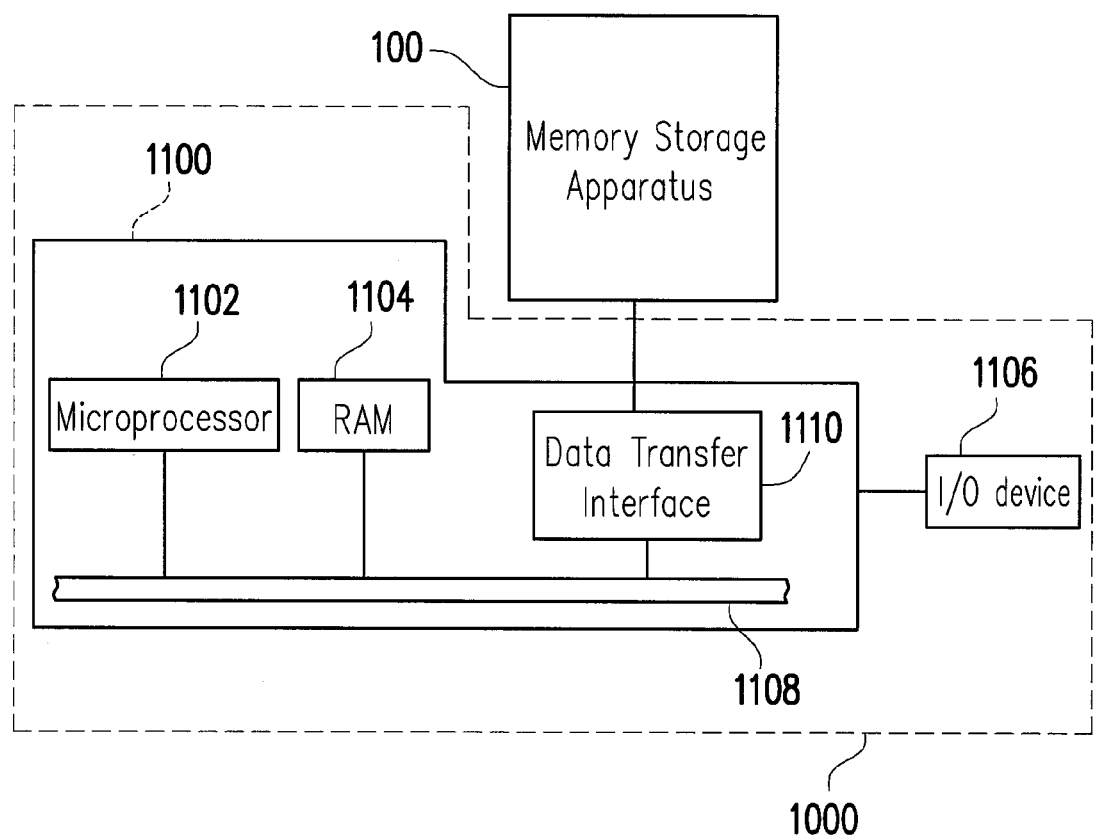
FIG. 2A is a schematic diagram illustrating a host system and a memory storage apparatus according to a first exemplary embodiment of the present invention.
Figure 2B:
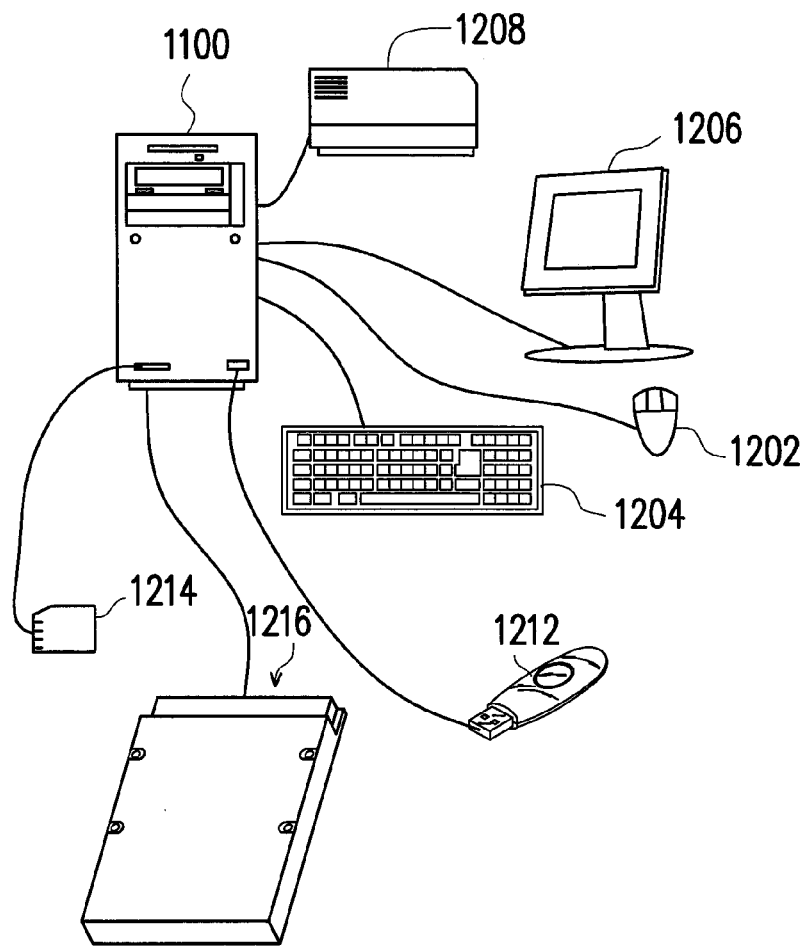
FIG. 2B is a schematic diagram illustrating a computer, an input/output device and a memory storage apparatus according to the first exemplary embodiment of the present invention.
Figure 2C:
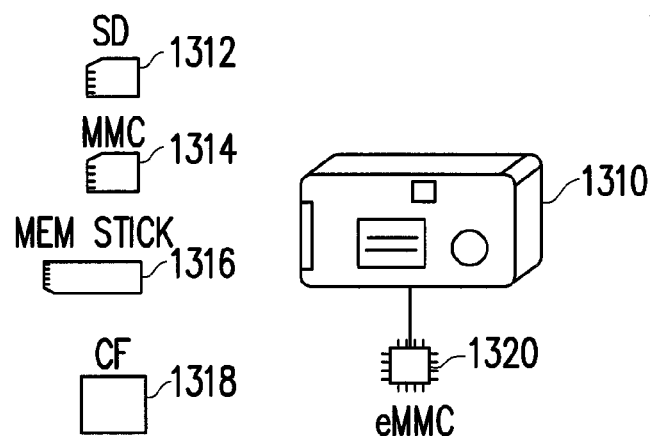
FIG. 2C is a schematic diagram illustrating host system and memory storage apparatus according to an example.

FIG. 2A is a schematic diagram illustrating a host system and a memory storage apparatus according to the first exemplary embodiment of the present invention. FIG. 2B is a schematic diagram illustrating a computer, an input/output device and a memory storage apparatus according to the first exemplary embodiment of the present invention. FIG. 2C is a schematic diagram illustrating the host system and the memory storage apparatus according to an example.

Referring to FIG. 2A, host system 1000 generally includes a computer 1100 and an I/O (input/output) device 1106. The computer 1100 may include a microprocessor 1102, a RAM (random access memory) 1104, a system bus 1108 and a data transmission interface 1110. The input/output device 1106 may include a mouse 1202, a keyboard 1204, a monitor 1206 and a printer 1208 as shown in FIG. 2B. It is to be understood that the devices as shown in FIG. 2B do not intend to limit the input/output device 1106, and the input/output device 1106 may include other devices.

In the embodiment of the present invention, memory storage apparatus 100 electrically connected to other elements of the host system through the data transmission interface 1110. By the operation of the microprocessor 1102, the random access memory 1104 and the input/output device 1106, the data may be written into the memory storage apparatus 100 or read from the memory storage apparatus 100. For example, the memory storage apparatus 100 may be a rewritable non-volatile memory storage apparatus such as a flash drive 1212, a memory card 1214 or a SSD (solid state drive) 1216 as shown in FIG. 2B.

Generally, the host system 1000 can substantially be any system operated together with the memory storage apparatus 100 for storing data. Even though the host system 1000 is described as a computer system in the present exemplary embodiment, the host system 1000 in another exemplary embodiment may be a digital camera, a video camera, a communication device, an audio player, a video player, and so forth. For instance, if the host system is a digital camera (video camera) 1310, the rewritable non-volatile memory storage apparatus is an SD card 1312, an MMC 1314, a memory stick 1316, a CF card 1318, or an embedded storage apparatus 1320 (as shown in FIG. 5). The embedded storage device 1320 includes an embedded MMC (eMMC). It should be mentioned that the eMMC is directly coupled to the substrate of the host system.

Figure 3:
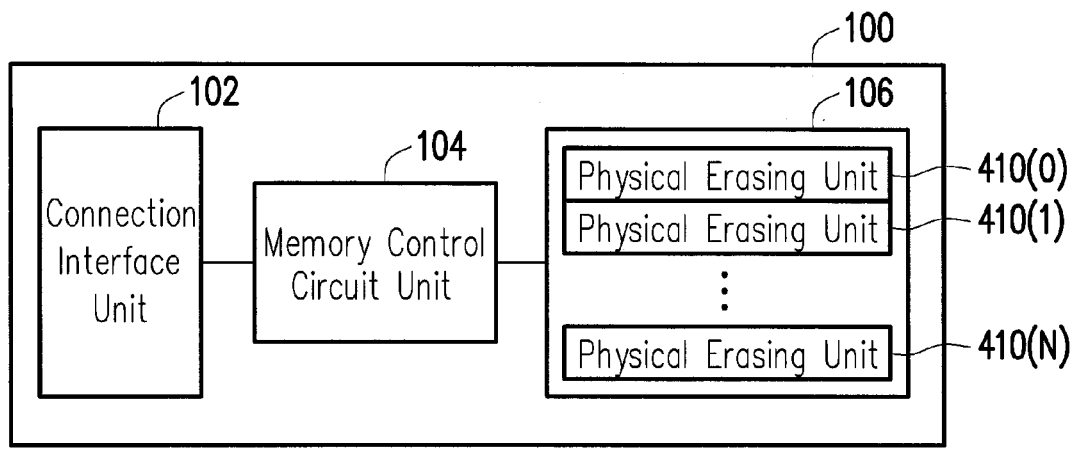
FIG. 3 is a schematic block diagram illustrating the memory storage apparatus as shown in FIG. 2A.

FIG. 3 is a schematic block diagram illustrating the memory storage apparatus as shown in FIG. 2A.

Referring to FIG. 3, the memory storage apparatus 100 includes a connection interface unit 102, a memory control circuit unit 104 and a rewritable non-volatile memory module 106.

In the present exemplary embodiment, the connection interface unit 102 complies with the serial advanced technology attachment (SATA) standard. However, it should be understood that the present invention is not limited thereto. The connection interface unit 102 may also comply with the parallel advanced technology attachment (PATA) standard, the Institute of Electrical and Electronic Engineers (IEEE) 1394 standard, the peripheral component interconnect (PCI) express standard, the secure digital (SD) interface standard, the universal serial bus (USB) standard, the ultra-high speed-I (UHS-I) interface standard, the ultra-high speed-II (UHS-II) interface standard, the memory stick (MS) interface standard, the multimedia card (MMC) standard, the embedded multimedia card (eMMC) interface standard, the universal flash storage (UFS) interface standard, the compact flash (CF) standard, the integrated device electronics (IDE) standard, or other suitable standards. In the present exemplary embodiment, the connection interface unit may be encapsulated with the memory control circuit unit in one chip or disposed outside the chip including the memory control circuit unit.

The memory control circuit unit 104 is configured to execute a plurality of logic gates or control instructions implemented in a form of hardware or firmware and performing various data operations in the rewritable non-volatile memory module 106 according to commands issued by the host system 1000, such as data writing, reading, erasing, merging, and so on.

The rewritable non-volatile memory module 106 is coupled to the memory control circuit unit 104 and configured to store the data written by the host system 1000. The rewritable non-volatile memory module 106 includes a plurality of physical erasing units 410(0)-410(N). For instance, the physical erasing units 410(0)-410(N) can belong to the same memory die or different memory dies. Each of the physical erasing units includes a plurality of physical programming units, for example, in the exemplary embodiment of the invention, every physical erasing unit includes 258 physical programming units, wherein the physical programming units which belong to the same physical erasing unit can be written separately but erased altogether at the same time. However, the present invention is not limited thereto, and each of the physical erasing units may also be constituted by 64, 256, or any other number of physical programming units.

To be more specific, the physical erasing unit is the minimum erasing unit. That is to say, each of the physical erasing units has a minimum number of memory cells for being erased altogether. The physical programming unit is the minimum programming unit. Namely, a physical programming unit is the minimum unit for writing the data. Each of the physical programming units usually includes a data bit area and a redundant bit area. The data bit area includes a plurality of physical accessing addresses for storing user data, and the redundant bit area is used for storing system data (e.g., control information and error correcting code (ECC)). In the exemplary embodiment, the data bit area of every physical programming unit may include 4 physical accessing addresses, and the size of one physical accessing address is 512 bytes. However, in other exemplary embodiment, the data bit area also may include more or less number of the physical accessing addresses, and the present invention is not limited thereto. For example, in an exemplary embodiment, a physical erasing unit is a physical block, and a physical programming unit is a physical page or a physical sector, but the invention is not limited thereto.

In the present exemplary embodiment, rewritable non-volatile memory module 106 is the MLC (Multi Level Cell) NAND flash memory module, that is, a memory cell may store at least 2 bits of data. However, the present invention is not limited thereto. Rewritable non-volatile memory module 106 may also be the SLC (Single Level Cell) NAND flash memory module, the TLC (Triple Level Cell) NAND flash memory module, other flash memory module or other flash memory module with the same characteristic.

Figure 4:
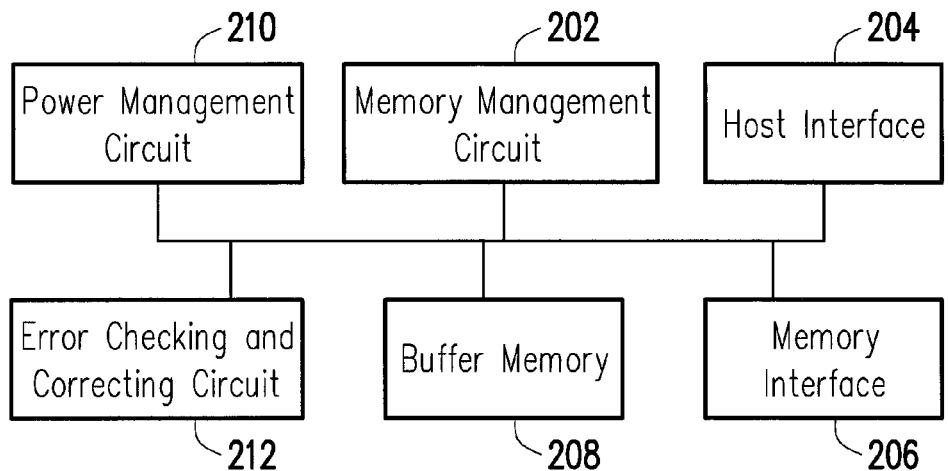
FIG. 4 is a schematic block diagram illustrating the memory control circuit unit according to the first exemplary embodiment.

FIG. 4 is a schematic block diagram illustrating the memory control circuit unit according to the first exemplary embodiment.

Referring to FIG. 4, memory control circuit unit 104 includes a memory management circuit 202, a host interface 204 and a memory interface 206.

The memory management circuit 202 is configured to control the whole operation of the memory control circuit unit 104. Particularly, the memory management circuit 202 has a plurality of control instructions, and when the memory storage apparatus 100 is operated, the control instructions are executed to perform a data writing operation, a data reading operation, a data erasing operation, and so on.

In the exemplary embodiment, the control instructions of the memory management circuit 202 are implemented in a form of a firmware. For example, the memory management circuit 202 includes a microprocessor unit (not shown) and a read-only memory (ROM, not shown), where the control instructions are burned into the read-only memory. When the memory storage apparatus 100 is operated, the control instructions are executed by a microprocessor unit to perform a data writing operation, a data reading operation, a data erasing operation, and so on.

In another exemplary embodiment, the control instructions of the memory managing circuit 202 may also be stored in a specific block (for example, a system block in a memory module exclusively used for storing system data) of the rewritable non-volatile memory module 106 as a programming code. Moreover, the memory managing circuit 202 includes a microprocessor unit (not shown), a read-only memory (ROM, not shown) and a random access memory (not shown). In particular, the ROM has a boot code, and when the memory control circuit unit 104 is enabled, the microprocessor unit first executes the boot code to load the control driving code from the rewritable non-volatile memory module 106 into the RAM of the memory management circuit 202. Afterward, the microprocessor unit then executes the control driving code to perform a data writing operation, a data reading operation, a data erasing operation, and so on.

Furthermore, in another exemplary embodiment, the control commands of the memory management circuit 202 are implemented in a form of hardware. For example, the memory management circuit 202 includes a micro controller, a memory cell managing circuit, a memory writing circuit, a memory reading circuit, a memory erasing circuit and a data processing circuit. The memory managing circuit, the memory writing circuit, the memory reading circuit, the memory erasing circuit and the data processing circuit are electrically connected to the micro controller. Wherein, the memory management circuit is configured for managing the physical erasing units of the rewritable non-volatile memory module 106; the memory writing circuit is configured for issuing the write command to the rewritable non-volatile memory module 106 in order to write the data into the rewritable non-volatile memory module 106; the memory reading circuit is configured for issuing the read command to the rewritable non-volatile memory module 106 in order to read the data from the rewritable non-volatile memory module 106, the memory erasing circuit is configured for issuing the erasing command to the rewritable non-volatile memory module 106 in order to erase the data in the rewritable non-volatile memory module 106, and the data processing circuit is configured for processing the data which is intended to be written into the rewritable non-volatile memory module 106 and the data which is intended to be read from the rewritable non-volatile memory module 106.

The host interface 204 is coupled to the memory management circuit 202 and the connection interface unit 102 and configured to receive and identify the commands and data transmitted by the host system 1000. That is, the commands and data transmitted by the host system 1000 are transferred to memory management circuit 202 through the host interface 204. In the present exemplary embodiment, the host interface 204 is compatible with SATA standard. However, it is to be understood that the present invention is not limited thereto. The host interface may be compatible with the PATA standard, the IEEE 1394 standard, the PCIE standard, the USB standard, the UHS-I interface standard, the UHS-II interface standard, the SD standard, the MS standard, the MMC standard, the CF standard, the IDE standard of other suitable data transfer standards.

The memory interface 206 is coupled to the memory management circuit 202 and configured to access the rewritable non-volatile memory module 106. That is, the data to write to the rewritable non-volatile memory module 106 is converted to the form that is acceptable by the rewritable non-volatile memory module 106 through the memory interface 206.

In an exemplary embodiment, the memory control circuit unit 104 further includes a buffer memory 208, a power management circuit 210 and an error checking and correcting circuit 212.

The buffer memory 208 is electrically connected to the memory management circuit 202 and configured to temporarily store the data and commands from the host system 1000 or the data from the rewritable non-volatile memory module 106.

The power managing circuit 210 is electrically connected to the memory management circuit 202 and configured to control the power of the memory storage device 100.

The error checking and correcting circuit 212 is coupled to the memory management circuit 202 and configured to perform an error checking and correcting process to assure the accuracy of data. To be more specific, when the memory management circuit 202 receives a write command from the host system 1000, the error checking and correcting circuit 212 generates an error checking and correcting code (ECC code) corresponding to the data of the write command, and the memory management circuit 202 writes the data corresponding to the write command and the corresponding ECC code into the rewritable non-volatile memory module 106. Afterwards, when the memory management circuit 202 reads the data from the rewritable non-volatile memory module 106, the corresponding error checking and correcting code is also be read, and the error checking and correcting circuit 212 executes the error checking and correcting process to the read data according to the ECC code. Specifically, the error checking and correcting circuit 212 is designed to correct a number of error bits (hereinafter referred to as the number of maximum correctable error bits). For example, assuming that the number of maximum correctable error bits is 48, the error checking and correcting circuit 212 is able to correct the error bits to the correct value according to the correction code if the number of error bits occurred in the data being read is not greater than 48. Otherwise, the error checking and correcting circuit 212 reports a correction failure and the memory management circuit 202 sends the message of designated data lost to the host system 1000.

Figure 5A:
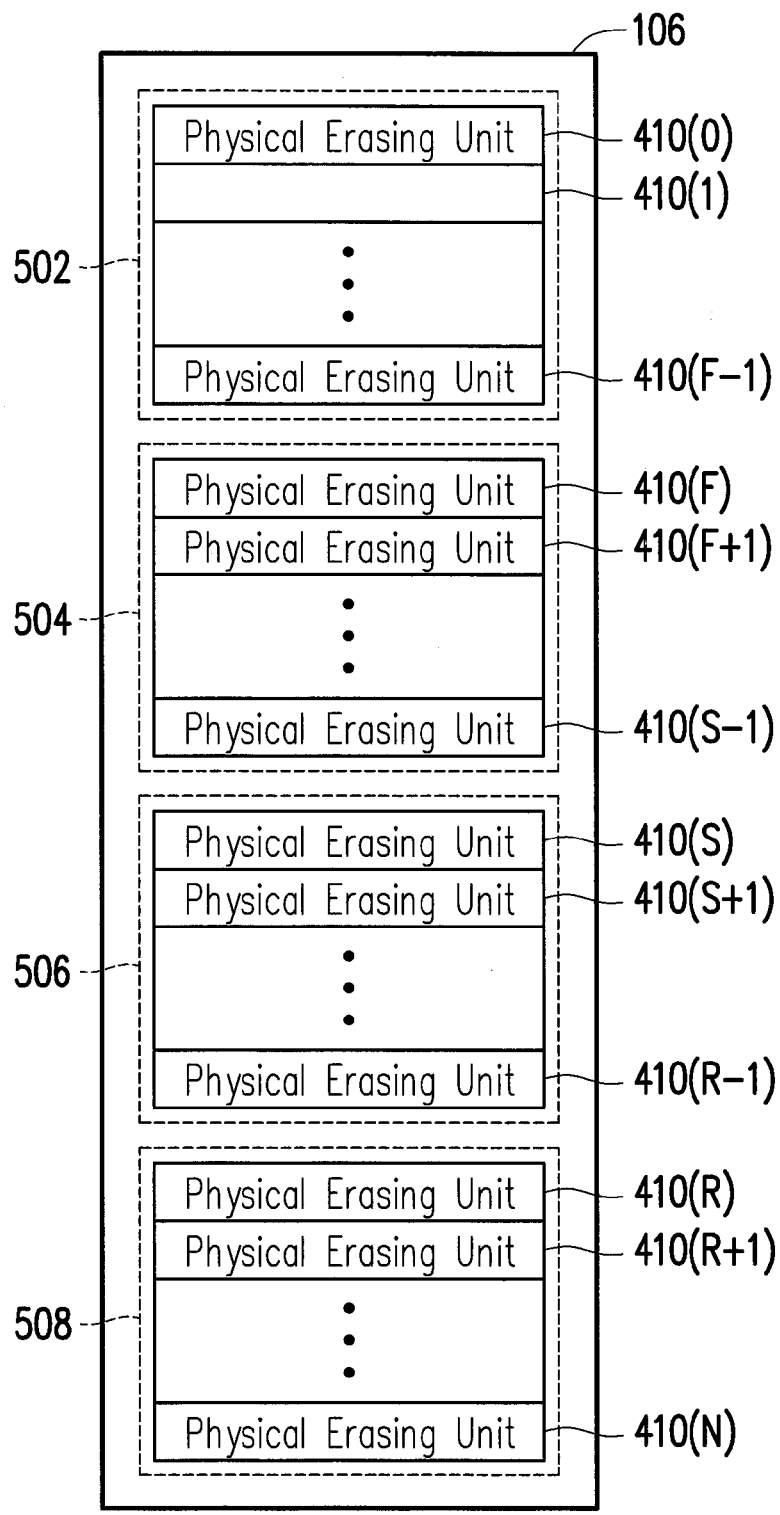
FIG. 5A and FIG. 5B are example diagrams of managing physical erasing units according to the first exemplary embodiment.
Figure 5B:
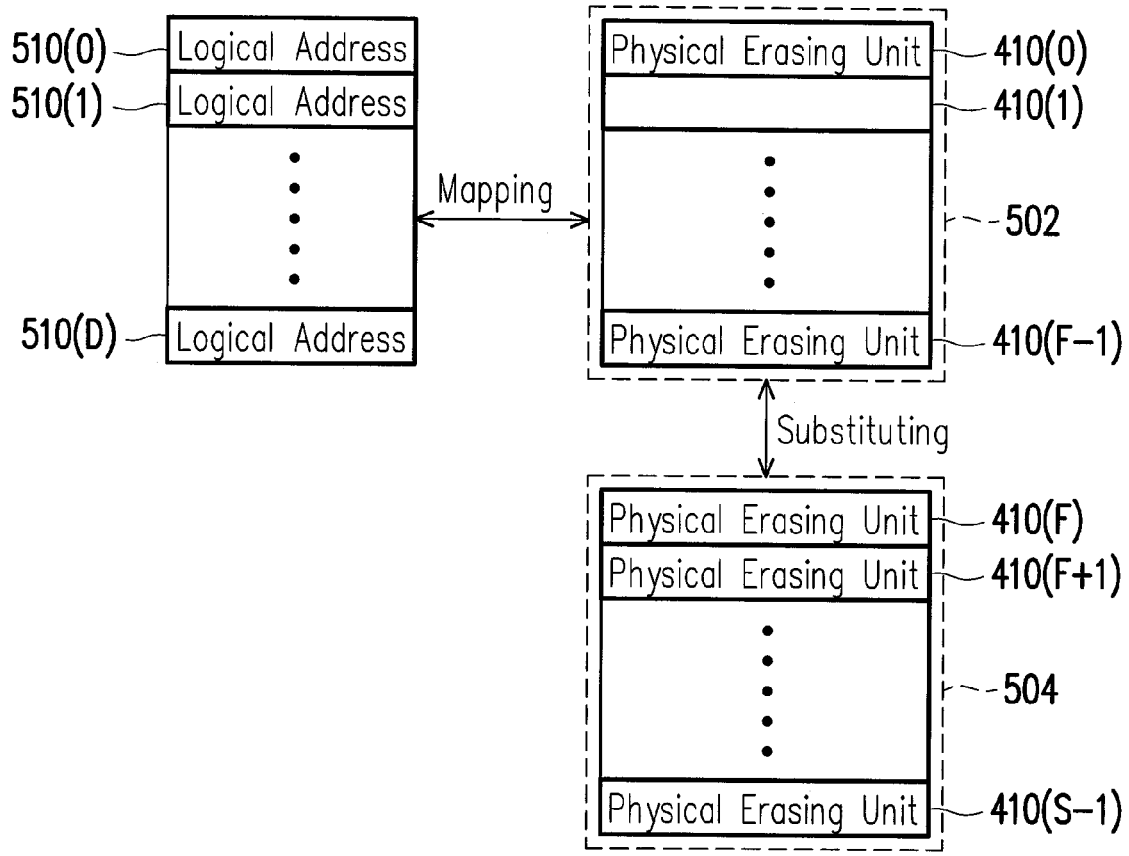

FIG. 5A and FIG. 5B are example diagrams illustrating physical erasing unit management according to the first exemplary embodiment.

It is to be understood that the description of the operation of the physical erasing unit of the rewritable non-volatile memory module such as "select", "move", "replace", "substitute", "alternate", and "group" used herein are merely a logical concept. That is, the physical address of the physical erasing unit of the rewritable non-volatile memory module is not changed, and the operation of the physical erasing unit of the rewritable non-volatile memory module is executed logically.

Referring to FIG. 5A, memory control circuit unit 104 (or memory management circuit 202) logically groups the physical erasing units into data area 502, spare area 504, system area 506 and replacement area 508.

The physical erasing units logically belonging to the data area 502 and the spare area 504 are configured for storing data from the host system 1000. To be specific, the physical erasing units of the data area 502 are the physical erasing units which have been used for storing data, and the physical erasing units of the spare area 504 are the physical erasing units which are used for substituting the physical erasing units of the data area 502. Namely, when a write command and data to be written are received from the host system 1000, the memory management circuit 202 selects physical erasing units from the spare area 504 and writes the data into the selected physical erasing units for substituting the physical erasing units of the data area 502.

The physical erasing units logically belonging to the system area 506 are used for recording system data. For instance, the system data includes the manufacturers and models of the rewritable non-volatile memory module, the number of physical erasing units in the rewritable non-volatile memory modules, the number of physical programming units in each physical erasing unit, and so on.

The physical erasing units logically belonging to the replacement area 508 are used in a bad physical erasing unit replacement procedure for replacing damaged physical erasing units. To be specific, if there still exists normal physical erasing units in the replacement area 508, and a physical erasing unit in the data area 502 is damaged, the memory management circuit 202 selects a normal physical erasing unit from the replacement area 508 to replace the damaged physical erasing unit.

In particular, the numbers of physical erasing units in the data area 502, the spare area 504, the system area 506 and the replacement area 508 are various based on different memory module standards. Additionally, it has to be understood that the grouping relationships of grouping the physical erasing units into the data area 502, the spare area 504, the system area 506 and the replacement area 508 are dynamically changed during the operations of the memory storage apparatus 100. For example, when a physical erasing unit in the spare area 504 is damaged and then replaced by a physical erasing unit of the replacement area 508, the physical erasing unit of the replacement area 508 is associated with the spare area 504.

Referring to FIG. 5B, the memory control circuit unit 104 (or memory management circuit 202) configures logical addresses 510(0)~510(D) to map to a portion of the physical erasing units 414(0)~410(F−1) of the data area 502. The host system 1000 accesses data in the data area 502 through the logical addresses 510(0)~510(D). Furthermore, the memory control circuit unit 104 (or memory management circuit 202) establishes a logical address-physical erasing unit mapping table to record the mapping relationship between the logical addresses and the physical erasing units. The logical address-physical erasing unit mapping table, for example, may further record a variety of logical and physical corresponding relationship such as the mapping relationships of logical addresses and physical pages, logical pages and physical pages and/or logical pages and physical erasing unit, and the present invention is not limited thereto.

Figure 6A:
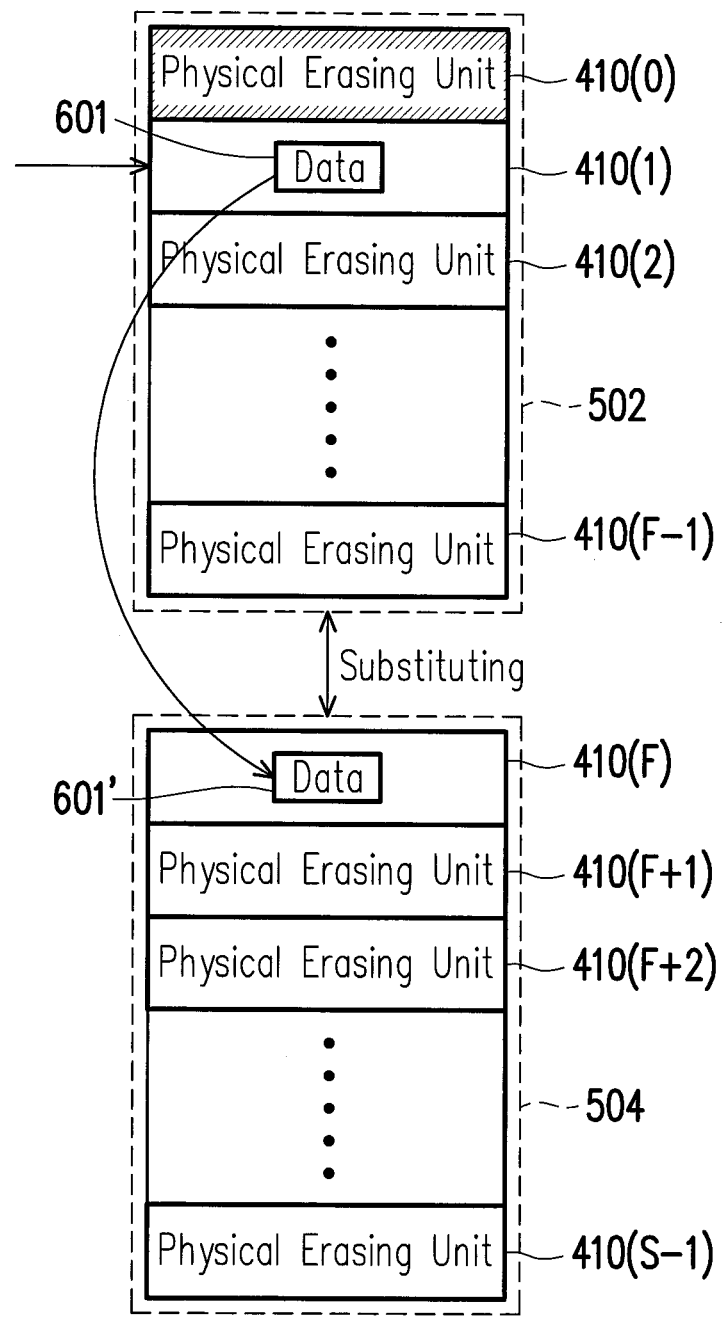
FIG. 6A and FIG. 6B are example diagrams of managing the rewritable non-volatile memory module according to the first exemplary embodiment.
Figure 6B:
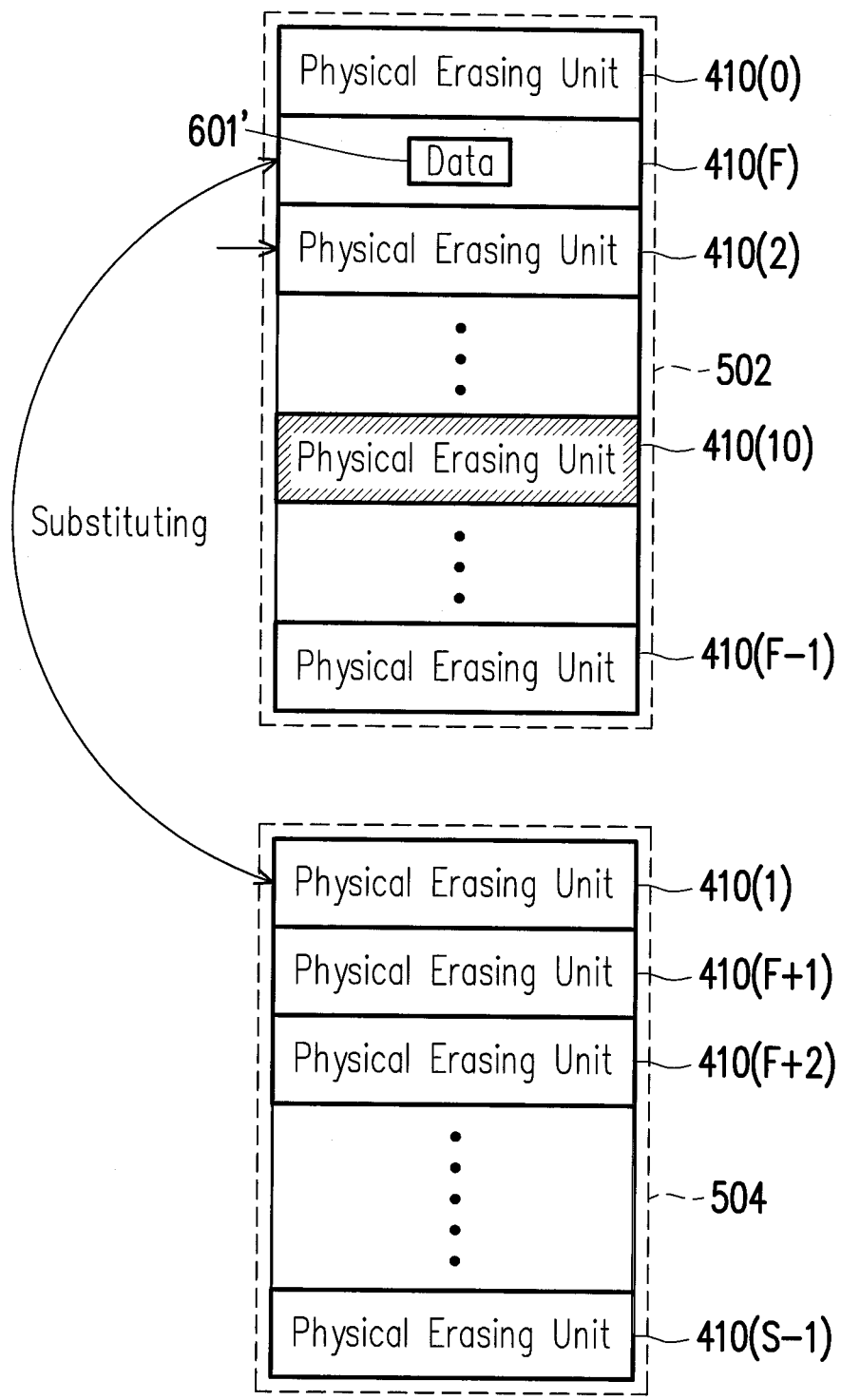

FIG. 6A and FIG. 6B are example diagrams of managing the rewritable non-volatile memory module according to the first exemplary embodiment.

Referring to FIG. 6A, the memory control circuit unit 104 (or memory management circuit 202) initially sets an operation numeral value to 0 and counts the operation numeral value upon receiving the operation command (e.g., write command or read command) from the host system 1000. For example, the memory control circuit unit 104 (or memory management circuit 202) constantly refreshes and accumulates the operation numerical value according to the read command sent from the host system 1000. If the operation numerical value is not smaller than an operation numerical threshold (e.g., 10000), the memory control circuit unit 104 (or memory management circuit 202) selects a second physical erasing unit 410(1) from the physical erasing units of the data area 504 excluding a first physical erasing unit 410(0) corresponding to the read command sent from the host system 1000 and read data 601 from the second physical erasing unit 410(1).

As described above, when reading data from the physical erasing unit, the memory control circuit unit 104 (or memory management circuit 202) determines whether error bits exist in the read data according to corresponding error checking and correcting code and attempts to correct the error bits. In the exemplary embodiment of the present invention, under the circumstance of the number of error bits is smaller than the number of maximum correctable error bit, the memory control circuit unit 104 (or memory management circuit 202) not only corrects the error bits but determines if the data need to be moved according to the mechanism of determining if the operation numerical value is not smaller than the threshold and identification of the number of error bits occurred on the read data.

For example, under the circumstance as shown in FIG. 6A, the memory control circuit unit 104 (or memory management circuit 202) reads data 601 from the second physical erasing unit and identifies the error bits of the data 601 read from the second physical erasing unit 410(1). If the number of error bits in the read data 601 is greater than a first error bit number threshold and smaller than a second error bit number threshold, the memory control circuit unit 104 (or memory management circuit 202) selects a third physical erasing unit 410(F) from the physical erasing unit of spare area 504 and writes the corrected data into the third physical erasing unit 410(F) after correcting the error bits of the read data 601, wherein the second error bit number threshold is greater than the first error bit number threshold. Then, referring to FIG. 6B, the memory control circuit unit 104 (or memory management circuit 202) re-adjusts the mapping relationship between the logical addresses and the physical erasing units and associates the third erasing unit 410(F) storing valid data with the data area 502, and the second physical erasing unit 410(1) is associated with the spare area 504 after the data in the second physical erasing unit 410(1) is erased. Here, the operation of determining if the number of error bits in the data of the second physical erasing unit is greater than the first error bit number threshold and smaller than the second error bit number threshold to re-store the corrected data to another physical erasing unit and re-adjust the mapping relationship between the logical addresses and the physical erasing units is called "the operation for preventing read-disturb errors".

Particularly, when reading data from the memory cells, the memory control circuit unit 104 (or memory management circuit 202) issues a read command to the rewritable non-volatile memory module 106, and the rewritable non-volatile memory module 106 applies default read voltage to the word line coupling to the memory cell to be read to verify the channel storage status of the memory cell. For example, in the process of writing and erasing, the memory cells of the rewritable non-volatile memory module 106 may have structural wearing through injections and removal of the electrons, thereby causing the increase of electron writing speed and the widening or shifting of the threshold voltage distribution. Accordingly, the memory control circuit unit 104 (or memory management circuit 202) may not be able to accurately distinguish the storage status of the memory cells. That is, in the operation of determining if the number of error bits in the data of the second physical erasing unit is greater than the first error bit number threshold and smaller than the second error bit number threshold as described above, there are many reasons that error bits may occur due to the shifting of the threshold voltage distribution, such as the read-disturb, the long-term storage of the data and the memory cell consumption.

Specifically, in the exemplary embodiment of the present invention, the second error bit number threshold is the maximum correctable error bit number as described above, that is, if memory control circuit unit 104 (or memory management circuit 202) identifies that the error bits of the read data is greater than the second error bit number threshold, the error checking and correcting circuit 212 reports an error correction failure and memory control circuit unit 104 (or memory management circuit 202) sends the message of designated data lost to the host system 1000.

Particularly, in the first exemplary embodiment of the present invention, memory control circuit unit 104 (or memory management circuit 202) sequentially selects the second physical erasing unit among the physical erasing unit excluding the first physical erasing unit 410(0) corresponding to the currently received read command. Referring to FIG. 6B, for example, if the host system 1000 intends to read the data in the physical erasing unit 410(10) under the circumstance as shown in FIG. 6A and the operation numerical value is not smaller than the threshold, memory control circuit unit 104 (or memory management circuit 202) identifies that at the last time the physical erasing unit 410(1) substituted by the physical erasing unit 410(F) is used as the physical erasing unit executing the operation for preventing read-disturb errors, therefore, memory control circuit unit 104 (or memory management circuit 202) sequentially selects the physical erasing unit 410(2), which is next to the physical erasing unit 410(F), and executes the operation for preventing read-disturb errors thereto.

It is worth noting that in the exemplary embodiment of the present invention, by setting the operation numerical value to 10000, memory control circuit unit 104 (or memory management circuit 202) reads another physical erasing unit not corresponding to the $10000^{th}$ time read command among the physical erasing units of the data area 502 and executes the operation for preventing read-disturb errors every time when the read command sent from the host system 1000 is accumulated to 10000 times such that the physical erasing units in the rewritable non-volatile memory module can be managed and monitored equally. Because read-disturb errors usually occur after hundreds of thousand, million, or tenth of million times of reading a specific physical erasing unit, in the embodiment of the present invention the operation numeral value is set to 10000, that is, every time the number of performing the read command is counted to 10000, the memory storage apparatus 100 has a chance to check the status of the physical erasing units of the data area 502 of the rewritable non-volatile memory module to avoid the occurrence of read-disturb errors. However, it is worth noting that the present invention is not limited thereto, and the present invention may adjust the setting of the operation numerical value according to the performance of the memory storage apparatus 100.

Furthermore, in the exemplary embodiment of the present invention, the number of operation is explained by the example of read command, that is, the memory control circuit unit 104 (or memory management circuit 202) selects the physical erasing unit not corresponding to the currently received operation command every time the read command sent from the host system 1000 is accumulated to 10000 times to execute the operation for preventing data-disturb errors. However, the present invention is not limited thereto. The memory control circuit unit 104 (or memory management circuit 202) may select the physical erasing unit not corresponding to the currently received write command every time the write command sent from the host system 1000 is accumulated to 10000 times to execute the operation for preventing data-disturb errors, or the memory control circuit unit 104 (or memory management circuit 202) may select the physical erasing unit not corresponding to the currently received operation command (read command or write command) every time both the read command and the write command sent from the host system 1000 are accumulated to 10000 times to execute the operation for preventing data-disturb errors. Furthermore, in the exemplary embodiment of the present invention, the memory control circuit unit 104 (or memory management circuit 202) may further select the physical erasing unit not corresponding to the currently received erase operation command every time the erase command sent from the host system 1000 is accumulated to 10000 times to execute the operation for preventing data-disturb errors, or select the physical erasing unit not corresponding to the currently received operation command (read command, write command or erase command) every time the sum of the number of the read command, write command and erase command sent from the host system 1000 are accumulated to 10000 times to execute the operation for preventing data-disturb errors.

In an exemplary embodiment, the memory control circuit unit 104 (or memory management circuit 202) selects the physical erasing unit not corresponding to the currently received operation command to execute the operation for preventing read-disturb errors if the operation numeral value is not smaller than the threshold (e.g., 10000). Moreover, the operation numerical value is set to zero after the memory control circuit unit 104 (or memory management circuit 202) finishes executing the operation for preventing read-disturb errors such that the operation numerical value is re-counted when the memory control circuit unit 104 (or memory management circuit 202) receives other operation command (e.g., read command or write command) from the host system.

Figure 7A:
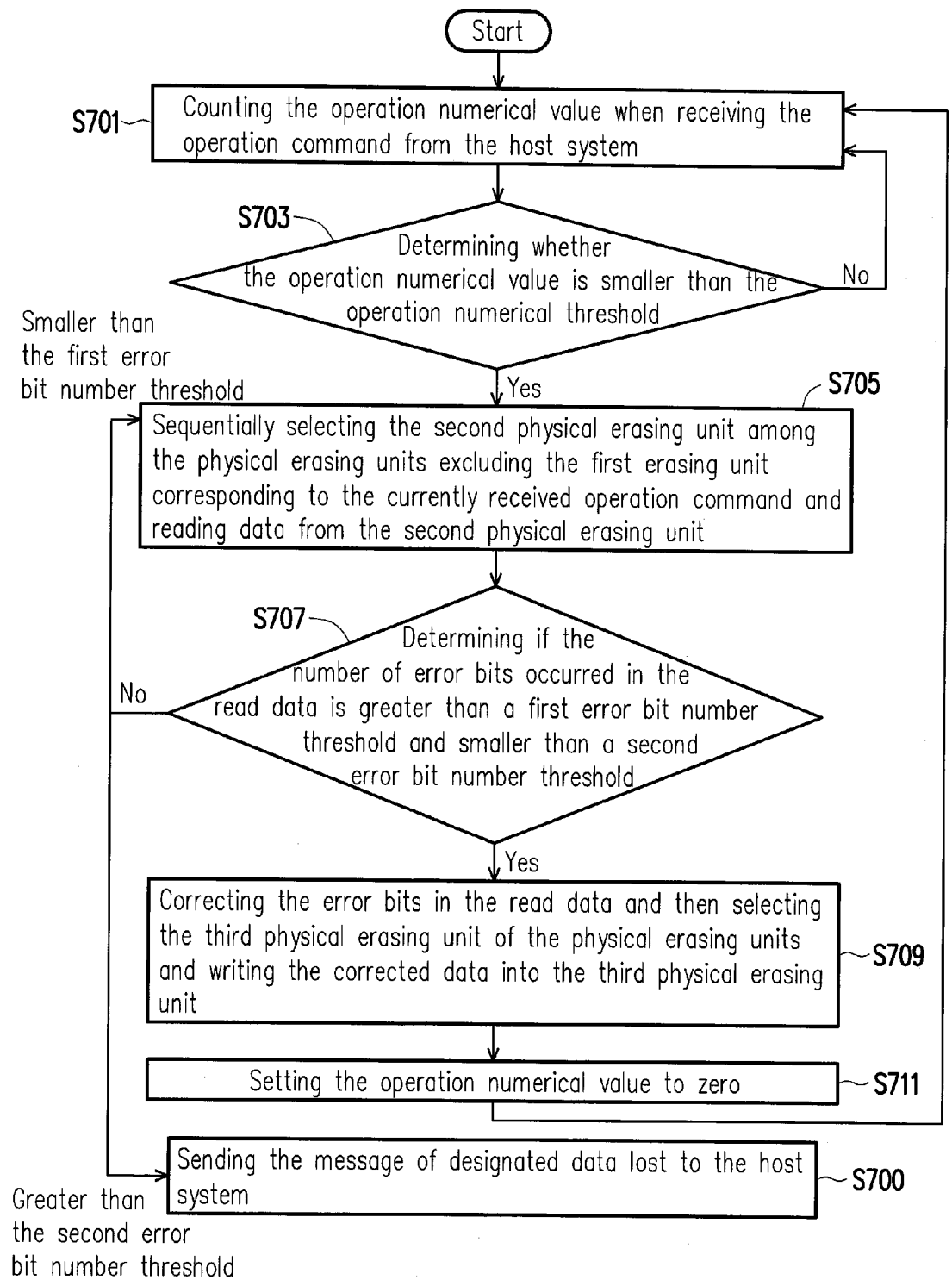
FIG. 7A and FIG. 7B are flowcharts illustrating a method for preventing read-disturb errors according to the first exemplary embodiment.
Figure 7B:
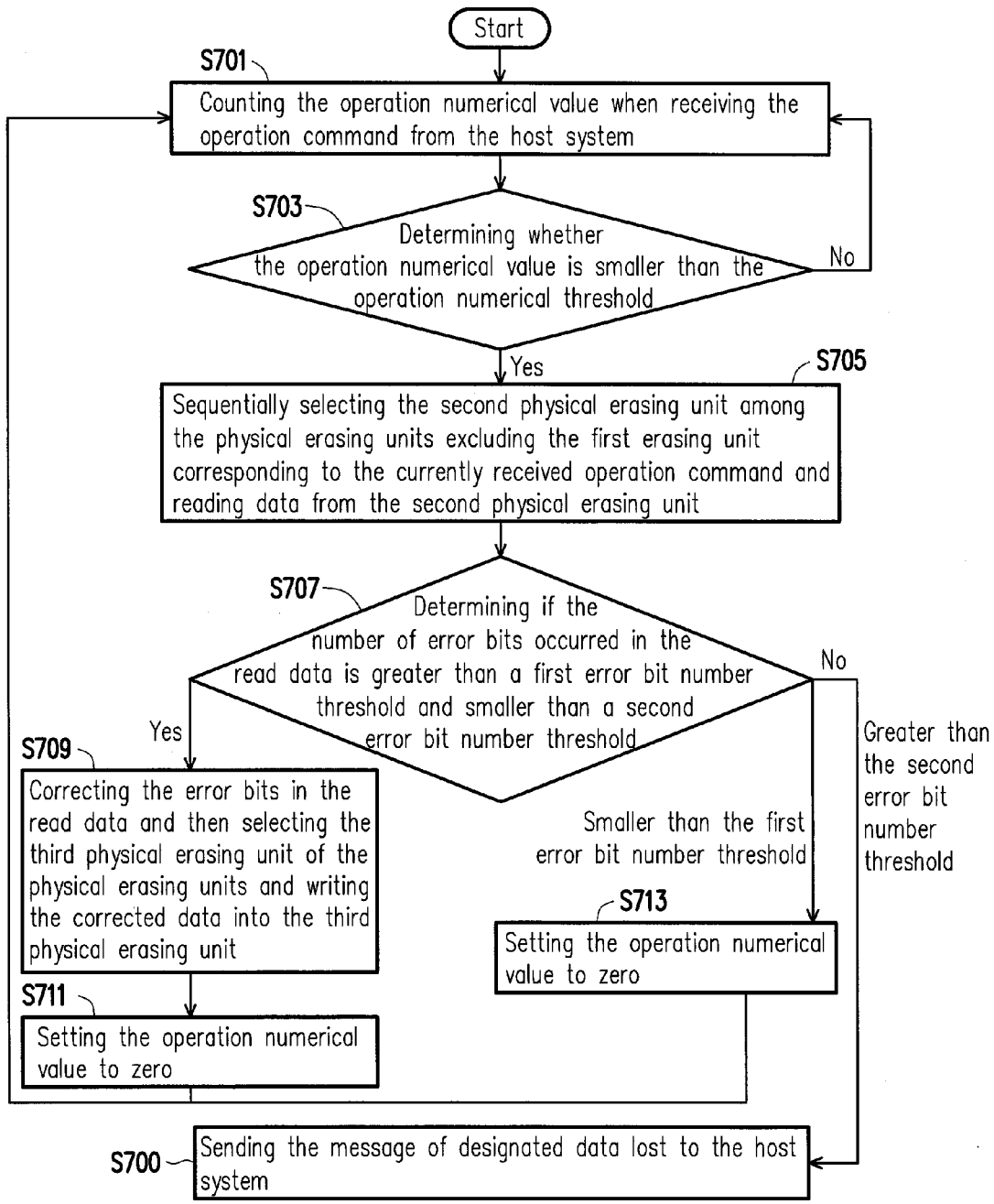

FIG. 7A and FIG. 7B are flowcharts illustrating a method for preventing read-disturb errors according to the first exemplary embodiment.

Referring to FIG. 7A, in step S701, the memory control circuit unit 104 (or memory management circuit 202) counts the operation numerical value when receiving operation command (e.g., read command or write command) from the host system.

In step S703, the memory control circuit unit 104 (or memory management circuit 202) determines whether the counted operation numerical value is smaller than the operation numerical threshold.

If the operation numerical value is not smaller than the operation numerical threshold, in step S705, the memory control circuit unit 104 (or memory management circuit 202) sequentially selects the second physical erasing unit among the physical erasing units excluding the first erasing unit corresponding to the currently received operation command and reads data from the second physical erasing unit. Otherwise, if the operation numerical value is smaller than the operation numerical threshold, the memory control circuit unit 104 (or memory management circuit 202) performs step S701 to count the operation numerical value when receiving the operation command from the host system.

Then, in step S707, the memory control circuit unit 104 (or memory management circuit 202) determines if the number of error bits occurred in the read data is greater than a first error bit number threshold and smaller than a second error bit number threshold.

If the number of error bits occurred in the read data is greater than a first error bit number threshold and smaller than a second error bit number threshold, in step S709, the memory control circuit unit 104 (or memory management circuit 202) corrects the error bits in the read data and then selects the third physical erasing unit of the physical erasing units and writes the corrected data into the third physical erasing unit. Otherwise, if the number of error bits occurred in the read data is smaller than the first error bit number threshold, return to step S705, and the memory control circuit unit 104 (or memory management circuit 202) sequentially selects the next physical erasing unit to execute the operation for preventing read-disturb errors. Furthermore, if the number of error bits occurred in the read data is greater than the second error bit number threshold, the memory control circuit unit 104 (or memory management circuit 202) sends the message of designated data lost to the host system in step S700.

Afterwards, in step S711, the memory control circuit unit 104 (or memory management circuit 202) sets the operation numerical value to zero and the memory control circuit unit 104 (or memory management circuit 202) performs step S701 to count the operation numerical value when receiving another operation command from the host system 1000.

It is worth noted that in another exemplary embodiment, in step S707, the memory control circuit unit 104 (or memory management circuit 202) may also set the operation numerical value to zero when the number of error bits in the read data is not larger than the first error bit number threshold. Referring to FIG. 7B, the method of preventing read-disturb errors as shown is FIG. 7B is substantially the same with that as shown in FIG. 7A except that in step S707, when the memory control circuit unit 104 (or memory management circuit 202) determines the number of error bits in the read data is smaller than the first error bit number threshold, step S713 is performed such that the memory control circuit unit 104 (or memory management circuit 202) to set the operation numerical number to zero and step S701 is performed such that the memory control circuit unit 104 (or memory management circuit 202) to re-count the operation numerical value when receiving the next operation command from the host system 1000. Particularly, in step S707 of FIG. 7A, the number of execution of repeatedly going back to step S705 to select the next physical erasing unit to execute the operation for preventing read-disturb errors when the error bit number of read data is always not greater than the first error bit number threshold is reduced, thereby improving the performance of the memory storage apparatus 100.

Second Exemplary Embodiment

The structure of the memory storage apparatus of the second exemplary embodiment is similar to that of the first exemplary embodiment except that the memory control circuit unit (or memory management circuit) of the second exemplary embodiment uses random method to select physical erasing unit to execute the operation for preventing read-disturb errors. The reference numerals of the first exemplary embodiment are used to illustrate the difference from the second exemplary embodiment hereinafter.

In the present exemplary embodiment, the memory control circuit unit 104 may further include a randomly selected module circuit (not shown), particularly, the memory control circuit unit 104 (or memory management circuit 202) executes an operation of random function through the randomly selected module circuit to select the physical erasing unit to execute the operation for preventing read-disturb errors. For example, the memory control circuit unit 104 (or memory management circuit 202) identifies the addresses 410(0)~410(F−1) of the physical erasing unit of the data area 502 of the rewritable non-volatile memory module and the physical erasing unit corresponding to the currently received operation command, bring in the physical addresses of the physical erasing units excluding the physical erasing unit corresponding to the currently received operation command to the random function, and the memory control circuit unit 104 (or memory management circuit 202) selects the physical erasing unit according to the physical address calculated from the randomly selected module circuit as the physical erasing unit for executing the operation for preventing read-disturb errors. Through randomly selecting the physical erasing unit, each of the physical erasing unit in the data area has a chance to be selected to check if read-disturb errors occur, and each of the physical erasing unit may be selected repeatedly to execute the operation for preventing read-disturb errors.

Figure 8A:
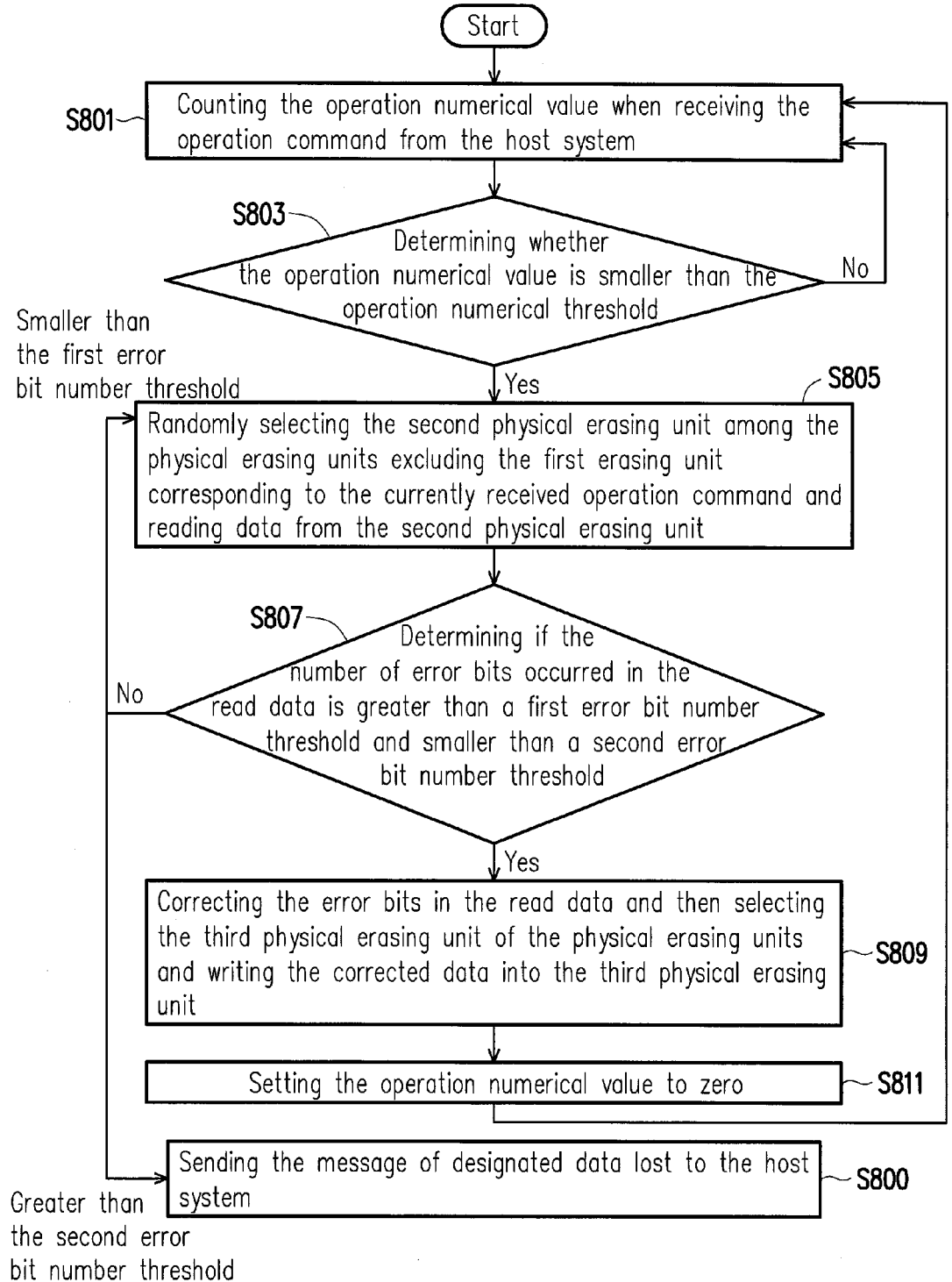
FIG. 8A and FIG. 8B are flowcharts illustrating a method for preventing read-disturb errors according to the second exemplary embodiment.
Figure 8B:
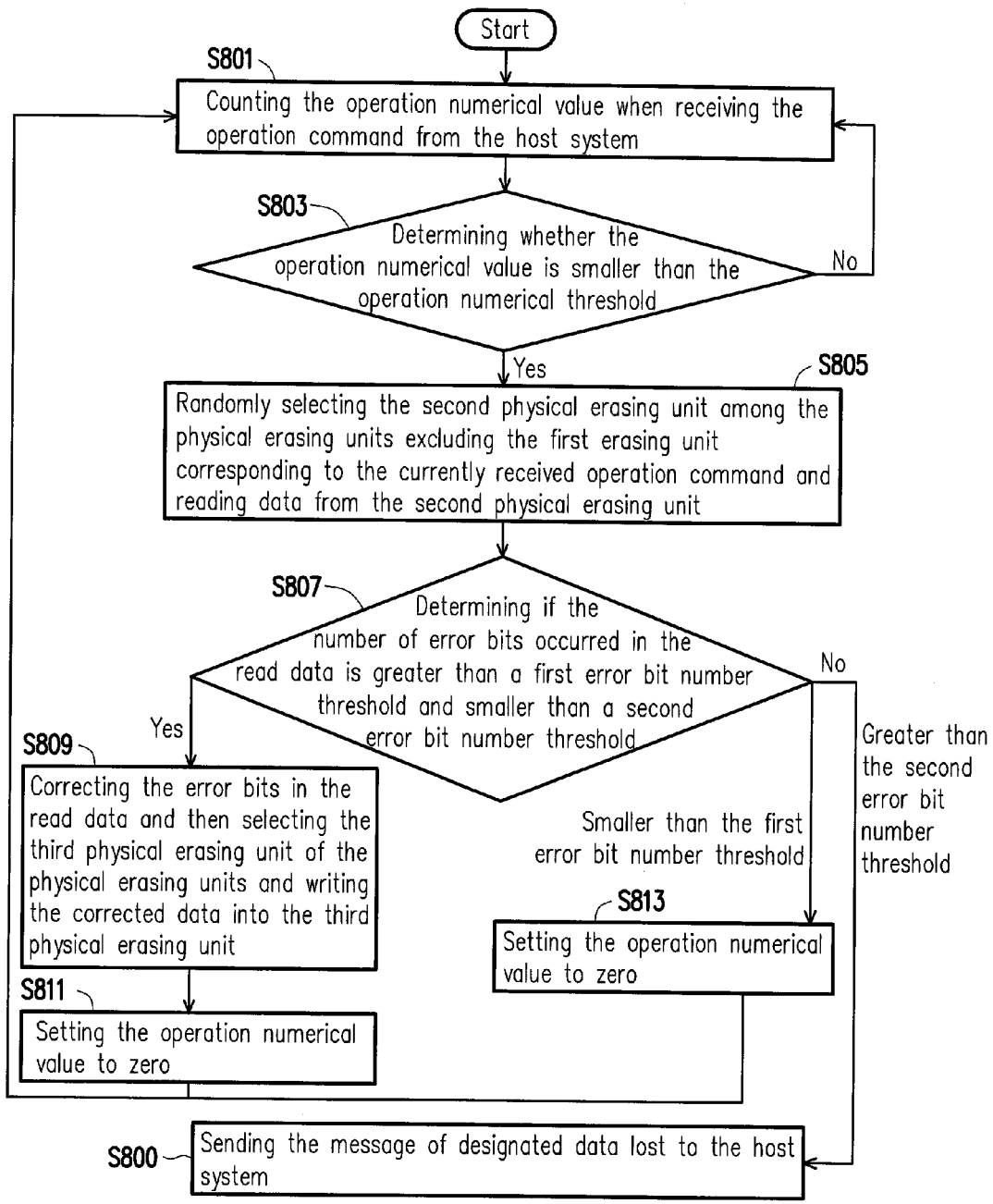

FIG. 8A and FIG. 8B are flowcharts illustrating a method for preventing read-disturb errors according to the second exemplary embodiment.

Referring to FIG. 8A, the method of preventing read-disturb as shown in FIG. 8A is substantially the same with that in FIG. 7A, wherein steps S800, S801, S803 and S807 to S811 are the same with steps S700, S701, S703 and S707 to S711 in FIG. 7A of the first exemplary embodiment and therefore the repetition is omitted. The difference from the first exemplary embodiment is that if the operation numerical number is not smaller than the operation numerical threshold, in step S805, the memory control circuit unit 104

(or memory management circuit 202) randomly selects the second physical erasing unit from the physical erasing units excluding the first physical erasing unit corresponding to the currently received operation command and reads data in the second physical erasing unit.

Referring to FIG. 8B, the method of preventing read-disturb errors as shown in FIG. 8B is substantially the same with that as shown in FIG. 7B, wherein steps S800, S801, S803 and S807 to S813 are the same with steps S700, S701, S703 and S707 to S713 of read data transferring method in FIG. 7B of the first exemplary embodiment and therefore the repetition is omitted. The difference from the first exemplary embodiment is that if the operation numerical number is not smaller than the threshold, in step S805, the memory control circuit unit 104 (or memory management circuit 202) randomly selects the second physical erasing unit from the physical erasing units excluding the first physical erasing unit corresponding to the currently received operation command and reads data in the second physical erasing unit.

Third Exemplary Embodiment

The structure of the memory storage apparatus of the third exemplary embodiment is similar to that of the first exemplary embodiment and the second exemplary embodiment, which both select the physical erasing unit in a random manner to execute the operation for preventing read-disturb errors. The difference is that in the third exemplary embodiment, the method of preventing read-disturb errors randomly selects a logical address first and then maps to the corresponding physical erasing unit, and the selected logical addresses are tagged such that the physical erasing unit selected each time to execute the operation for preventing read-disturb errors will not be repeated. The reference numerals of the first exemplary embodiment are used to illustrate the difference of the third exemplary embodiment hereinafter.

In the present exemplary embodiment, memory control circuit unit further includes a randomly selected module circuit (not shown), particularly, the memory control circuit unit 104 (or memory management circuit 202) executes an operation of random function through the randomly selected module circuit to select the physical erasing unit for executing the operation for preventing read-disturb errors. First, as described above, the memory control circuit unit 104 (or memory management circuit 202) configures multiple logical addresses 510(0)~510(D) to map to a portion of physical erasing units 410(0)~410 (F−1) of the data area. Then, the memory control circuit unit 104 (or memory management circuit 202) further records a tag for each logical address. For example, memory control circuit unit 104 (or memory management circuit 202) initially records the tag of each logical address as a non-selected state. And, after one logical address is selected for performing the operation for preventing read-disturb errors, the tag of the one logical address is record as a selected state.

Accordingly, the same with the first and the second exemplary embodiment, when the memory control circuit unit 104 (or memory management circuit 202) count the operation numerical value when receiving the operation command from the host system 1000, and if the counted operation numerical value is not smaller than the operation numerical threshold, the memory control circuit unit 104 (or memory management circuit 202) randomly selects the first logical address recorded as the non-selected state from the logical addresses 510(0)~510(D) and selects the second physical erasing unit corresponding to the first logical address according to the logical address-physical erasing unit mapping table. Herein, the method of selecting the first logical address from the logical addresses 510(0)~510(D) is similar to that of the second exemplary embodiment. The memory control circuit unit 104 (or memory management circuit 202) identifies all the logical addresses recorded as the non-selected state in the data area of the rewritable non-volatile memory module and the logical address mapped by the physical erasing unit corresponding to the currently received operation command, brings the logical addresses, which are recorded as the non-selected state and exclude the logical address mapped by the physical erasing unit corresponding to the currently received operation command, into the random function, computes and selects the first logical address through the operation of the randomly selected module circuit, and gets the second physical erasing unit mapped by the first logical address computed by the randomly selected module circuit according to the physical address-physical erasing unit mapping table as the physical erasing unit to be executed the operation for preventing read-disturb errors.

Furthermore, in the present exemplary embodiment, when the memory control circuit unit 104 (or memory management circuit 202) determines that the number of error bits in the data read from the second physical erasing unit is greater than the first error bit number threshold and smaller than the second error bit number threshold, the memory control circuit unit 104 (or memory management circuit 202) corrects the error bits in the read data and then selects the third physical erasing unit from the physical erasing units of the spare area and writes the corrected data into the third physical erasing unit. Particularly, after that, the memory control circuit unit 104 (or memory management circuit 202) further maps the first logical address to the third physical erasing unit and re-record the tag of the first logical address as the non-selected state. Accordingly, the physical erasing units of the data area 502 of the rewritable non-volatile memory module are selected equally to check the number of error bits thereon to evaluate whether read disturb occurs such that the possibility of the read-disturb of the memory storage apparatus 100 is reduced.

Figure 9A:
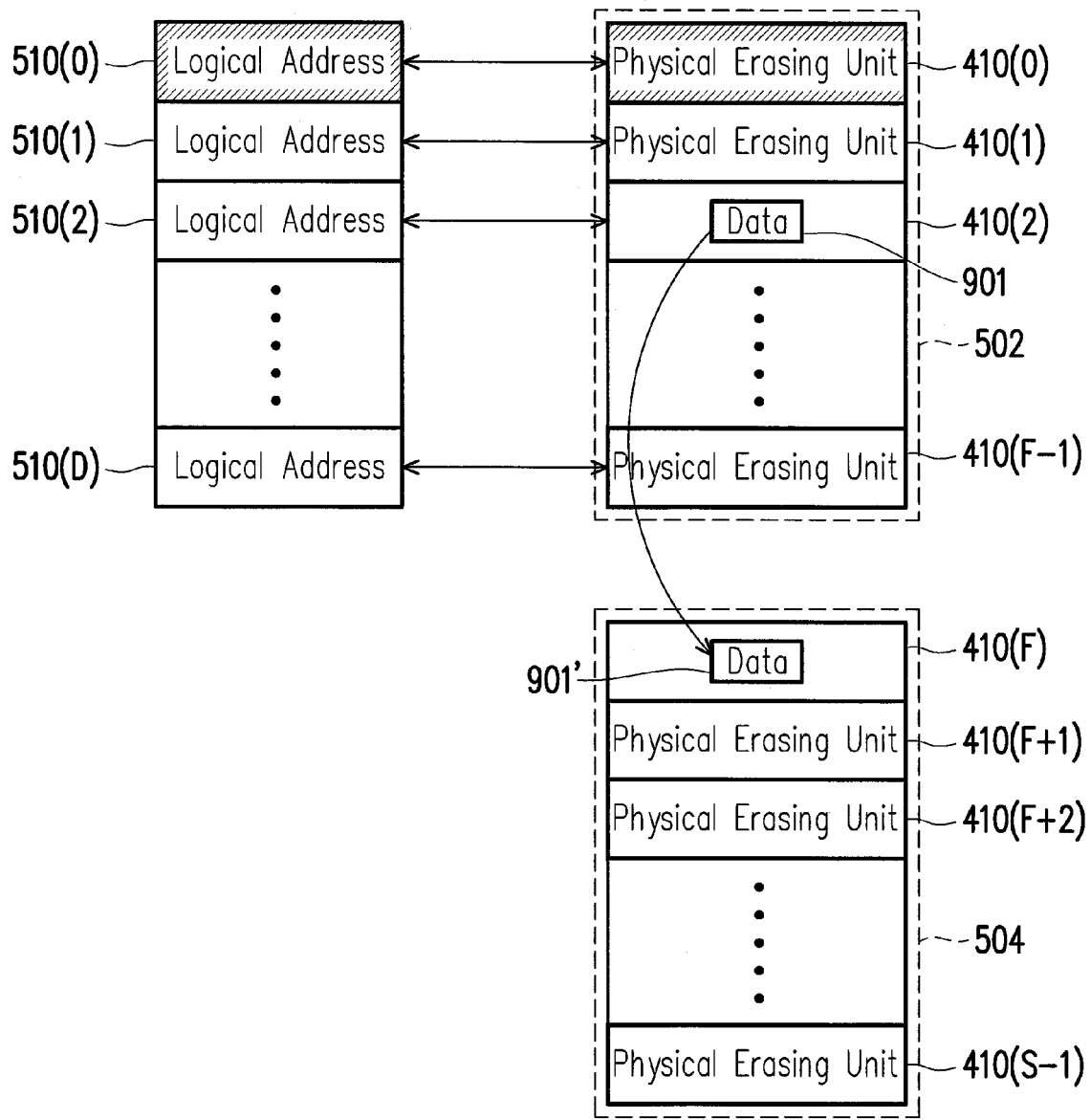
FIG. 9A~FIG. 9C are example diagrams of managing the rewritable non-volatile memory module management according to the first exemplary embodiment.
Figure 9B:
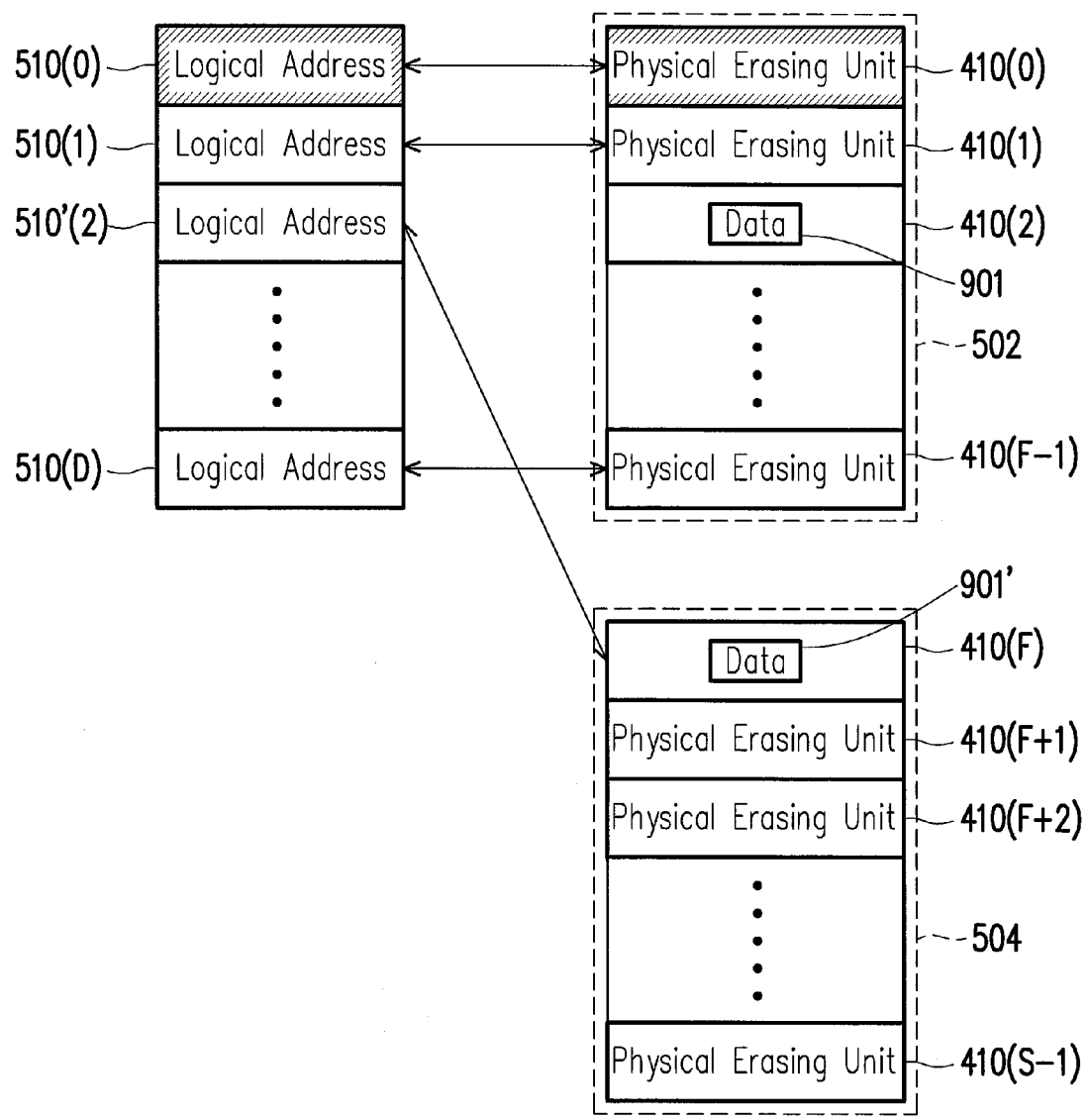
Figure 9C:
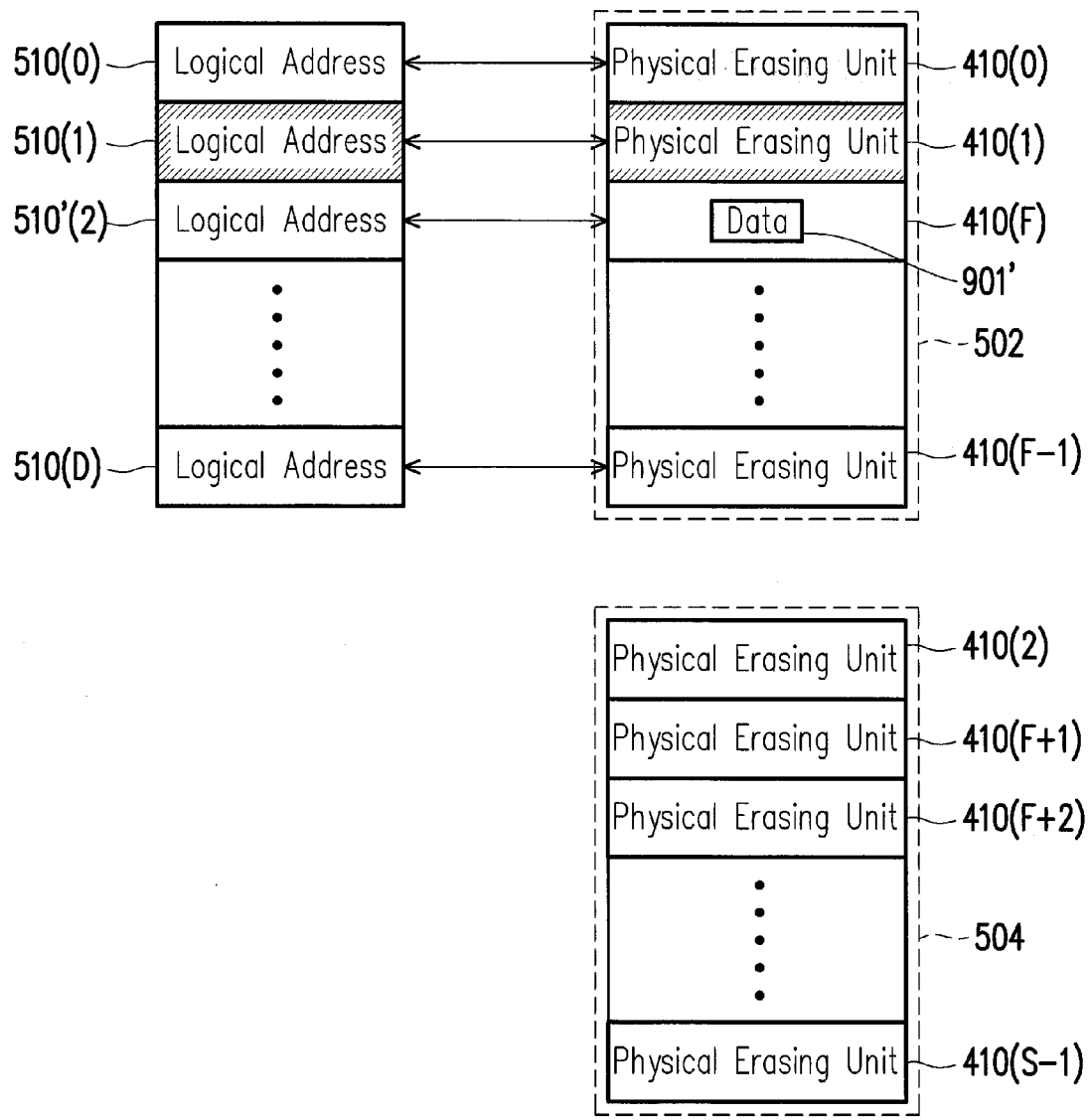

FIG. 9A~FIG. 9C are example diagrams of managing the rewritable non-volatile memory module according to the first exemplary embodiment.

Referring to FIG. 9A, the memory control circuit unit 104 (or memory management circuit 202) configures multiple logical addresses 510(0)~510(D) to map to the physical erasing units 414(0)~410(F−1) of the data area 502 and records the tag of each logical address as the non-selected state. The memory control circuit unit 104 (or memory management circuit 202) repeatedly refreshes and accumulates the operation numerical value according to the operation command (read command, write command or erase command) received from the host system 1000 and identifies that the logical addresses 510(0)~510(D) of the data area 502 are the non-selected state. Therefore, when the operation numerical value is not smaller than the threshold (e.g., 10000), the memory control circuit unit 104 (or memory management circuit 202) brings the logical addresses, which are recorded as the non-selected state and exclude the logical address mapped by the first physical erasing unit 410(0) corresponding to the currently received operation command, into the random function, computes and selects the first logical address 510(2) through the operation of the randomly selected module circuit, get the second physical erasing unit 410(2) mapped by the first logical address 510(2) computed by the randomly selected module circuit according to the logical address-physical erasing unit mapping table and reads data 901 from the second physical erasing unit 410(2).

For example, in the status as shown in FIG. 9A, the memory control circuit unit 104 (or memory management circuit 202) reads the data 901 and identifies error bits in the data read from the second physical erasing unit 410(2). If the number of error bits occurred in the read data 901 is greater than the first error bit number threshold and smaller than the second error bit number threshold, the memory control circuit unit 104 (or memory management circuit 202) selects the third physical erasing unit 410(F) from the physical erasing units of the spare area 504 and write the corrected data 901 into the third physical erasing unit 410(F) after the memory control circuit unit 104 (or memory management circuit 202) corrects the error bits in the read data 901. Then, the memory control circuit unit 104 (or memory management circuit 202) further maps the first logical address 510(2) to the third physical erasing unit 410(F) (as shown in FIG. 9B) and re-records the tag of the first logical address as the non-selected state (the first logical address 510'(2) as shown in FIG. 9B). Furthermore, referring to FIG. 9C, the memory control circuit unit 104 (or memory management circuit 202) associates the third physical erasing unit 410(F) storing valid data with the data area 502, and associates the second physical erasing unit with the spare area 504 after the data 901 in the second physical erasing unit 410(2) is erased.

Namely, if the host system 1000 is about to read the data in the physical erasing unit 410(1) in the circumstance as shown in FIG. 9C and the operation numerical value is not smaller than the threshold at present, the memory control circuit unit 104 (or memory management circuit 202) identifies all the logical addresses whose tags are recorded as the non-selected state (i.e., logical address 510(0), logical address 510(1) and logical address 510(3)~510(D)) and the logical address 510(1) mapped by the physical erasing unit corresponding to the currently received operation command, and brings the logical addresses, which are recorded as non-selected state and exclude the logical address 510(1) mapped by the first physical erasing unit corresponding to the currently received operation command (i.e., logical address 510(0) and logical addresses 510(3)~510(D)) into the random function, computes and selects the second logical address through the operation of the randomly selected module circuit, and gets the fourth physical erasing unit mapped by the second logical address computed by the randomly selected module circuit according to the physical address-physical erasing unit mapping table to be the physical erasing unit to be executed the operation for preventing read-disturb errors.

Figure 10A:
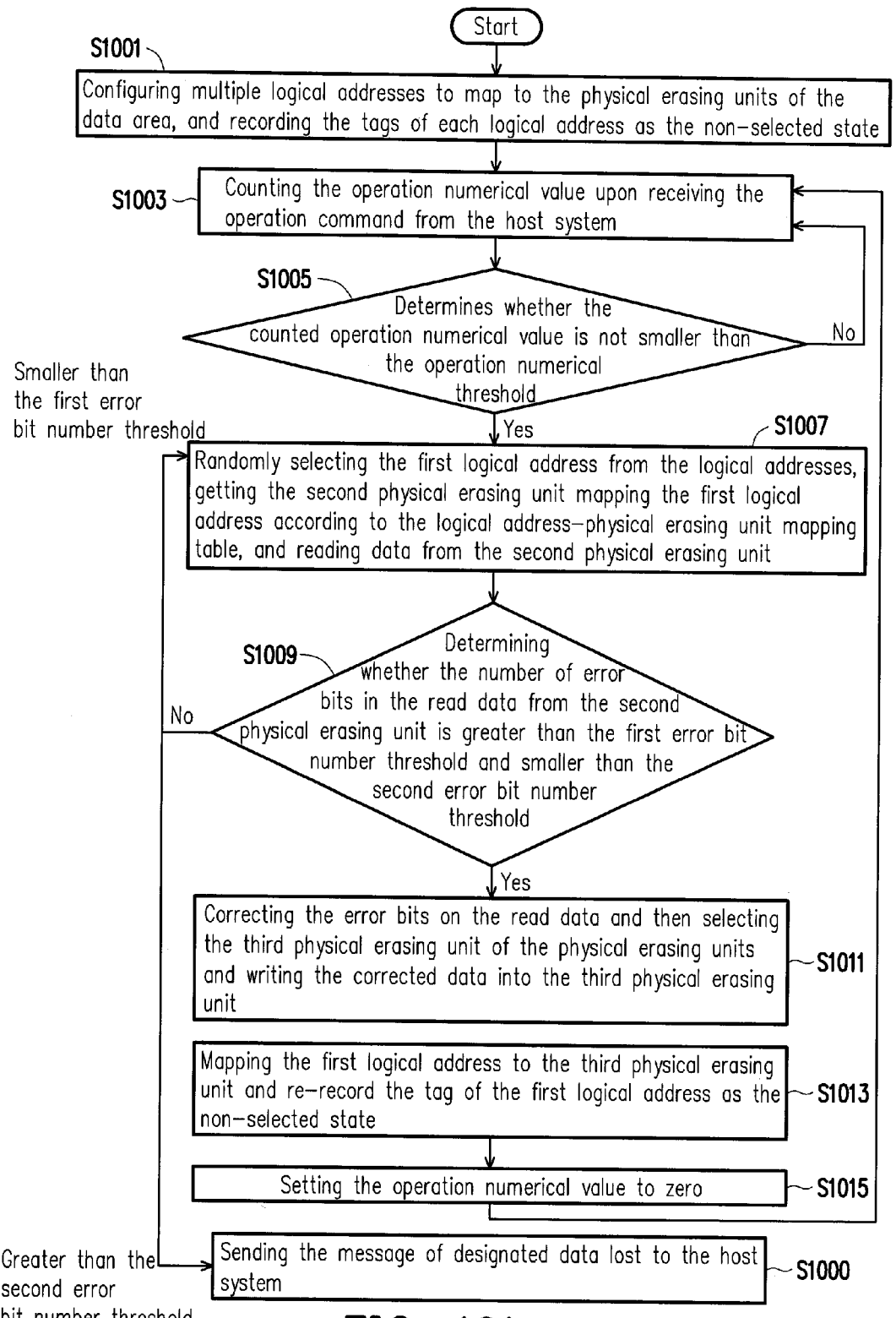
FIG. 10A and FIG. 10B are flowcharts illustrating a method for preventing read-disturb errors according to the third exemplary embodiment.
Figure 10B:
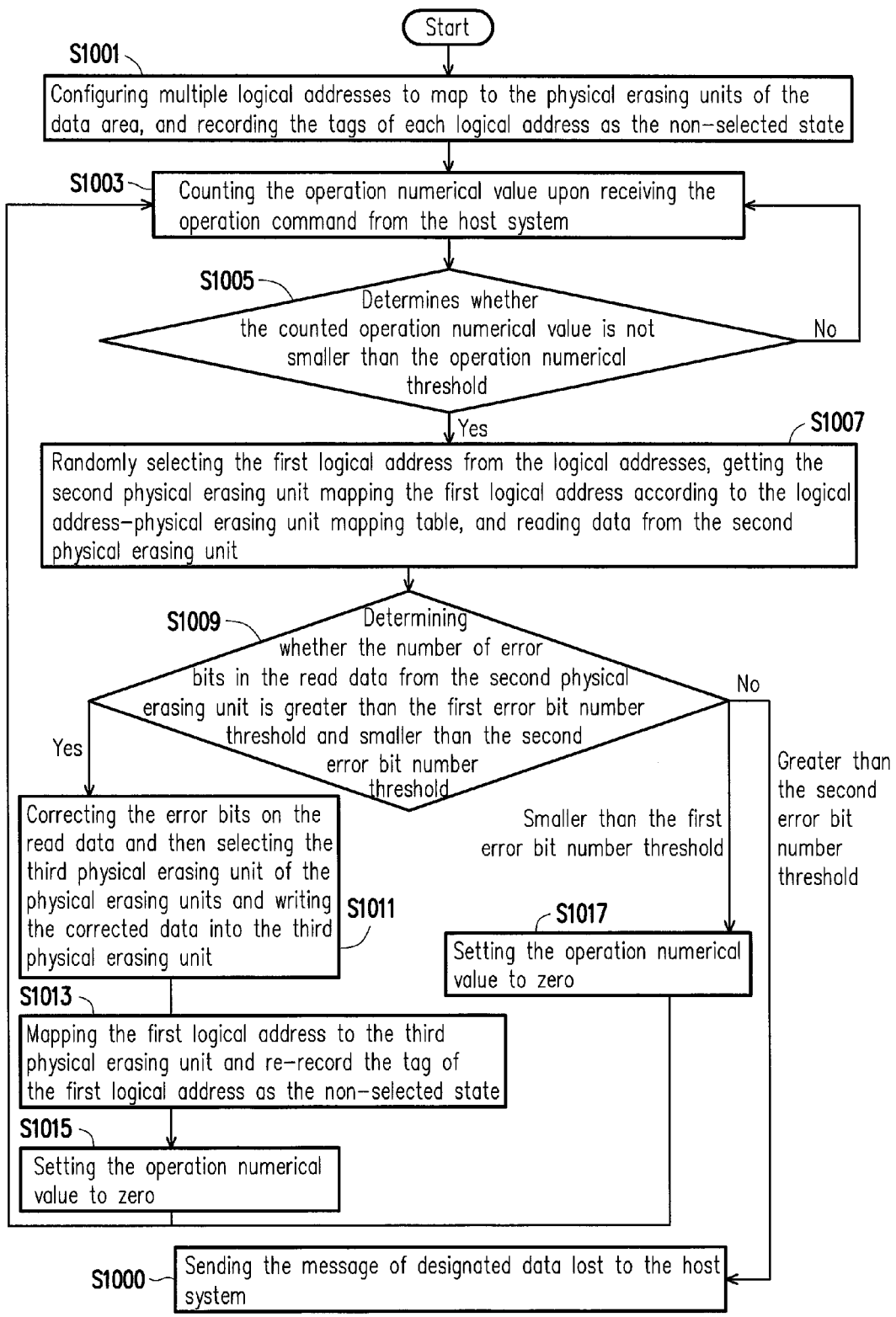

FIG. 10A and FIG. 10B are flowcharts illustrating method for preventing read-disturb errors according to the third exemplary embodiment.

Referring to FIG. 10A, in step S1001, the memory control circuit unit 104 (or memory management circuit 202) configures multiple logical addresses to map to the physical erasing units of the data area, and records the tags of each logical address as the non-selected state.

In step S1003, the memory control circuit unit 104 (or memory management circuit 202) counts the operation numerical value upon receiving the operation command (e.g., read command or write command) from the host system.

In step S1005, the memory control circuit unit 104 (or memory management circuit 202) determines whether the counted operation numerical value is not smaller than the operation numerical threshold. If the operation numerical value is not smaller than the operation numerical threshold, in step S1007, the memory control circuit unit 104 (or memory management circuit 202) randomly selects the first logical address from the logical addresses, gets the second physical erasing unit mapping the first logical address according to the logical address-physical erasing unit mapping table, and reads data from the second physical erasing unit. Otherwise, if the operation numerical value is smaller than the operation numerical threshold, step S1003 is performed to count the operation numerical value upon receiving the next operation command from the host system.

Then, in step S1009, the memory control circuit unit 104 (or memory management circuit 202) determines whether the number of error bits in the read data from the second physical erasing unit is greater than the first error bit number threshold and smaller than the second error bit number threshold.

If the number of error bit in the read data is greater than the first error bit number threshold and smaller than the second error bit number threshold, in step S1011, the memory control circuit unit 104 (or memory management circuit 202) corrects the error bits of the read data, selects the third physical erasing unit of the physical erasing units and writes the corrected data into the third physical erasing unit. Otherwise, if the number of error bits in the read data is smaller than the first error bit number threshold, step S1007 is performed to select the physical erasing unit mapped by another logical address in a random manner to execute the operation for preventing read-disturb errors. Furthermore, if the error bits in the read data is greater than the second error bit number threshold, in step S1000, the memory control circuit unit 104 (or memory management circuit 202) sends the message of designated data lost to the host.

In step S1013, the memory control circuit unit 104 (or memory management circuit 202) maps the first logical address to the third physical erasing unit and re-record the tag of the first logical address as the non-selected state.

Afterwards, in step S1015, the memory control circuit unit 104 (or memory management circuit 202) sets the operation numerical value to zero, and step S1003 is performed to count the operation numerical value upon receiving the next operation command from the host system.

Furthermore, the same with the first exemplary embodiment, the first exemplary embodiment of the present invention may also set the operation numerical value to zero when determining the number of error bits in the read data is smaller than the first error bit number threshold (as shown in step S1009 of FIG. 10B) in step S1009, to reduce the number of execution of repeatedly going back to step S1007 to select the next physical erasing unit to execute the operation for preventing read-disturb errors if the number of error bits in the read data is always not greater than the first error bit number threshold in step S1009 of FIG. 10A such that the performance of the memory storage apparatus 100 is improved.

As described above, the method for preventing read-disturb, memory control circuit unit and memory storage apparatus of the present invention selects the physical erasing unit not corresponding to the currently received operation command for performing the operation for preventing read-disturb errors when the operation numerical value corresponding to the operation command sent from the host system accumulates to an operation numerical threshold. Accordingly, the entire access status of the memory storage apparatus may be monitored and managed and the physical erasing units in the rewritable non-volatile memory module may be selected equally to check if data-disturb errors occur thereon to ensure the correctness of the data stored in the memory storage apparatus and effectively reduce the possibility of the occurrence of read-disturb errors. The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of preventing read-disturb errors for a rewritable non-volatile memory module comprising a plurality of physical erasing units, the method comprising:
    counting up an operation numerical value to update the operation numerical value from a first value to a second value when receiving an operation command from a host system, wherein a first physical erasing unit among the physical erasing units is selected to execute the operation command, and the second value is greater than the first value;
    selecting a second physical erasing unit storing data among the physical erasing units other than the first physical erasing unit and reading the data from the second physical erasing unit when the second value the operation numerical value is not smaller than an operation numerical threshold, wherein a value of the operation numerical threshold is a positive integer greater than 0, and the first value is smaller than the operation numerical threshold;
    determining whether a data error occurs at the second physical erasing unit according to the data read from the second physical erasing unit; and
    selecting a third physical erasing unit among the physical erasing units, correcting the data read from the second physical erasing unit to generate corrected data and writing the corrected data into the third physical erasing unit if the data error occurs at the second physical erasing unit.

2. The method of claim 1, further comprising:
    grouping the physical erasing units into at least a data area and a spare area;
    wherein the step of selecting the second physical erasing unit of the physical erasing units comprising:
    selecting the second physical erasing unit from the physical erasing units of the data area sequentially excluding the first physical erasing unit corresponding to the operation command.

3. The method of claim 1, further comprising:
    grouping the physical erasing units into at least a data area and a spare area;
    wherein the step of selecting the second physical erasing unit of the physical erasing units comprising:
    selecting the second physical erasing unit from the physical erasing units of the data area randomly excluding the first physical erasing unit corresponding to the operation command.

4. The method of claim 1, further comprising:
    grouping the physical erasing units into at least a data area and a spare area; and
    configuring a plurality of logical addresses, wherein the logical addresses map to the physical erasing units of the data area,
    wherein the step of selecting the second physical erasing unit of the physical erasing units comprising:
    selecting a first logical address from the logical addresses randomly, and getting the second physical erasing unit according to a logical address-physical erasing unit mapping table, wherein the first logical address maps to the second physical erasing unit in the logical address-physical erasing unit mapping table.

5. The method of claim 1, further comprising:
    recording a tag for each of the logical addresses, wherein the tag is recorded as a selected state or a non-selected state,
    wherein the tag of the first logical address is recorded as the non-selected state.

6. The method of claim 5, further comprising:
    re-recording the tag of the first logical address as the selected state after selecting the first logical address.

7. The method of claim 1, wherein the step of determining whether the data error occurs at the second physical erasing unit according to the data read from the second physical erasing unit comprising:
    determining that the data error occurs at the second physical erasing unit when the number of error bits in the data read from the second physical erasing unit is greater than a first error bit number threshold and smaller than a second error bit number threshold, wherein the second error bit number threshold is greater than the first error bit number threshold.

8. The method of claim 1, further comprising:
    setting the operation numerical value to zero after selecting the third physical erasing unit among the physical erasing units, correcting the data read from the second physical erasing unit to generate the corrected data and writing the corrected data into the third physical erasing unit.

9. The method of claim 1, further comprising:
    setting the operation numerical value to zero if the data error does not occur at the second physical erasing unit.

10. The method of claim 1, wherein the operation command is a read command, a write command or an erase command.

11. The method of claim 1, wherein the data error is caused by a read-disturb, a long-term storage of data or a memory cell consumption.

12. A memory control circuit unit for controlling a rewritable non-volatile memory module comprising a plurality of physical erasing units, the memory control circuit unit comprising:
    a host interface configured to couple to a host system;
    a memory interface configured to couple to the rewritable non-volatile memory module; and
    a memory management circuit coupled to the host interface and the memory interface,
    wherein the memory management circuit counts up an operation numerical value to update the operation numerical value from a first value to a second value when receiving an operation command from the host system, wherein a first physical erasing unit among the physical erasing units is selected to execute the operation command, and the second value is greater than the first value,
    wherein the memory management circuit selects a second physical erasing unit storing data among the physical erasing units other than the first physical erasing unit, and sends a first command sequence to read the data from the second physical erasing unit when the second value of the operation numerical value is not smaller than an operation numerical threshold, wherein a value of the operation numerical threshold is a positive integer greater than 0, and the first value is smaller than the operation numerical threshold, wherein the memory management circuit determines whether a data error occurs at the second physical erasing unit according to the data read from the second physical erasing unit, wherein if the data error occurs at the second physical erasing unit, the memory management circuit selects a third physical erasing unit of the physical erasing units, corrects the data read from the second physical erasing unit to generate corrected data and sends a second command sequence to write the corrected data into the third physical erasing unit.

13. The memory control circuit unit of claim 12, wherein the memory management circuit groups the physical erasing unit into at least a data area and a spare area, wherein the memory management circuit selects the second physical erasing unit from the physical erasing units of the data area sequentially excluding the first physical erasing unit corresponding to the operation command.

14. The memory control circuit unit of claim 12, wherein the memory management circuit groups the physical erasing unit into at least a data area and a spare area, wherein the memory management circuit selects the second physical erasing unit from the physical erasing units of the data area randomly excluding the first physical erasing unit corresponding to the operation command.

15. The memory control circuit unit of claim 12, wherein the memory management circuit groups the physical erasing unit into at least a data area and a spare area, wherein the memory management circuit configures a plurality of logical addresses, wherein the logical addresses map to the physical erasing units of the data area, wherein the memory management circuit selects a first logical address from the logical addresses randomly and gets the second physical erasing unit according to the logical address-physical erasing unit mapping table, wherein the first logical address in the logical address-physical erasing unit mapping table maps to the second physical erasing unit.

16. The memory control circuit unit of claim 15, wherein the memory management circuit records a tag for each of the logical addresses, wherein the tag is recorded as a selected state or a non-selected state, wherein the tag of the first logical address in recorded as the non-selected state.

17. The memory control circuit unit of claim 16, wherein the memory management circuit re-records the tag of the first logical address as the selected state after the memory management circuit selects the first logical address.

18. The memory control circuit unit of claim 12, wherein the memory management circuit determines the data error occurred at the second physical erasing unit when the number of error bits in the data read from the second physical erasing unit is greater than a first error bit number threshold and smaller than a second error bit number threshold, wherein the second error bit number threshold is greater than the first error bit number threshold.

19. The memory control circuit unit of claim 12, wherein the memory management circuit sets the operation numerical value to zero after the memory management circuit selects the third physical erasing unit among the physical erasing units, corrects the data read from the second physical erasing unit to generate corrected data and sends the second command sequence to write the corrected data into the third physical erasing unit.

20. The memory control circuit unit of claim 12, wherein the memory management circuit sets the operation numerical value to zero if the data error does not occur at the second physical erasing unit.

21. The memory control circuit unit of claim 12, wherein the operation command is a read command, a write command or an erase command.

22. The memory control circuit unit of claim 12, wherein the data error is caused by a read-disturb, a long-term storage of data or a memory cell consumption.

23. A memory storage apparatus, comprising:
a connection interface unit configured to couple to a host system;
a rewritable non-volatile memory module comprising a plurality of physical erasing units; and
a memory control circuit unit coupled to the connection interface unit and the rewritable non-volatile memory module,
wherein the memory control circuit unit counts up an operation numerical value to update the operation numerical value from a first value to a second value when receiving an operation command from the host system, wherein a first physical erasing unit among the physical erasing units is selected to execute the operation command, and the second value is greater than the first value,
wherein the memory control circuit unit selects a second physical erasing unit storing date among the physical erasing units other than the first physical erasing unit and read the data from the second physical erasing unit when the second value of the operation numerical value is not smaller than an operation numerical threshold, wherein a value of the operation numerical threshold is a positive integer greater than 0, and the first value is smaller than the operation numerical threshold,
wherein the memory control circuit unit determines whether a data error occurs at the second physical erasing unit according to the data read from the second physical erasing unit,
wherein if the data error occurs at the second physical erasing unit, the memory control circuit unit selects a third physical erasing unit among the physical erasing units, corrects the data read from the second physical erasing unit to generate a corrected data and writes the corrected data into the third physical erasing unit.

24. The memory storage apparatus of claim 23, wherein the memory control circuit unit groups the physical erasing unit into at least a data area and a spare area, wherein the memory control circuit unit selects the second physical erasing unit from the physical erasing units of the data area sequentially excluding the first physical erasing unit corresponding to the operation command.

25. The memory storage apparatus of claim 23, wherein the memory control circuit unit groups the physical erasing unit into at least a data area and a spare area, wherein the memory control circuit unit selects the second physical erasing unit from the physical erasing units of the data area randomly excluding the first physical erasing unit corresponding to the operation command.

26. The memory storage apparatus of claim 23, the memory control circuit unit groups the physical erasing unit into at least a data area and a spare area, wherein the memory control circuit unit configures a plurality of logical addresses, wherein the logical addresses map to the physical erasing units of the data area, wherein the memory control circuit unit selects a first logical address from the logical addresses randomly and gest the second physical erasing unit according to the logical address-physical erasing unit mapping table, wherein the first logical address in the logical address-physical erasing unit mapping table maps to the second physical erasing unit.

27. The memory storage apparatus of claim 26, wherein the memory control circuit unit records a tag for each of the logical addresses, wherein the tag is recorded as a selected state or a non-selected state, wherein the tag of the first logical address in recorded as the non-selected state.

28. The memory storage apparatus of claim 27, wherein the memory control circuit unit re-records the tag of the first logical address as the selected state after the memory control circuit unit selects the first logical address.

29. The memory storage apparatus of claim 23, wherein the memory control circuit unit determines the data error occurred at the second physical erasing unit when the number of error bits in the data read from the second physical erasing unit is Greater than a first error bit number threshold and smaller than a second error bit number threshold, wherein the second error bit number threshold is greater than the first error bit number threshold.

30. The memory storage apparatus of claim 23, wherein the memory control circuit unit sets the operation numerical value to zero after the memory control circuit unit selects the third physical erasing unit among the physical erasing units, corrects the data read from the second physical erasing unit to generate the corrected data and writes the corrected data into the third physical erasing unit.

31. The memory storage apparatus of claim 23, wherein the memory control circuit unit sets the operation numerical value to zero if the data error does not occur at the second physical erasing unit.

32. The memory storage apparatus of claim 23, wherein the operation command is a read command, a write command or an erase command.

33. The memory storage apparatus of claim 23, wherein the data error is caused by a read-disturb, a long-term storage of data or a memory cell consumption.

* * * * *